US012796346B2

(12) United States Patent
Anderson et al.

(10) Patent No.: US 12,796,346 B2
(45) Date of Patent: Nov. 10, 2026

(54) SEMICONDUCTOR DEVICE AND METHOD OF FORMING RADIATION HARDENED SUBSTANTIALLY DEFECT FREE SILICON CARBIDE SUBSTRATE

(71) Applicant: IceMos Technology Limited, Belfast (GB)

(72) Inventors: Samuel J. Anderson, Tempe, AZ (US); Takeshi Ishiguro, Fukushima (JP); Cathal Duffy, Belfast (GB); Aymeric Privat, Tempe, AZ (US)

(73) Assignee: IceMos Technology Limited (GB)

( * ) Notice: Subject to any disclaimer, the term of this patent is extended or adjusted under 35 U.S.C. 154(b) by 600 days.

(21) Appl. No.: 17/822,055

(22) Filed: Aug. 24, 2022

(65) Prior Publication Data

US 2023/0060866 A1 Mar. 2, 2023

Related U.S. Application Data

(63) Continuation-in-part of application No. 17/811,639, filed on Jul. 11, 2022.

(Continued)

(51) Int. Cl.

*H10P 14/20* (2026.01)
*H10D 12/01* (2025.01)

(Continued)

(52) U.S. Cl.

CPC ....... *H10P 14/2904* (2026.01); *H10D 12/031* (2025.01); *H10D 30/66* (2025.01);

(Continued)

(58) Field of Classification Search

None

See application file for complete search history.

(56) References Cited

U.S. PATENT DOCUMENTS 6,573,534 B1 6/2003 Kumar et al.
7,846,821 B2 12/2010 Ishiguro et al.

(Continued)

OTHER PUBLICATIONS

SiC crystallography—https://www.iue.tuwien.ac.at/phd/ayalew/node20.html.*

*Primary Examiner* — Julio J Maldonado
*Assistant Examiner* — Pinaki Das
(74) *Attorney, Agent, or Firm* — Robert D. Atkins; PATENT LAW GROUP: Atkins and Associates, P.C.

(57) ABSTRACT

A semiconductor device has a first substrate and a first semiconductor layer having a first semiconductor material formed over the first substrate. A surface of the first semiconductor layer has a first element of the first semiconductor material. A first surface of a second semiconductor layer having the first semiconductor material is joined to the surface of the first semiconductor layer. The first surface of the second semiconductor layer has a second element of the first semiconductor material different from the first element. The first semiconductor material is silicon carbide or cubic silicon carbide. The first element is silicon or carbon, and the second element is carbon or silicon. The semiconductor device provides characteristics of radiation hardening. A third semiconductor layer is formed over a second surface of the second semiconductor layer opposite the first surface. An electrical component is formed over the second semiconductor layer.

17 Claims, 31 Drawing Sheets

Related U.S. Application Data

(60) Provisional application No. 63/260,614, filed on Aug. 26, 2021.

(51) Int. Cl.

*H10D 30/66* (2025.01)
*H10D 62/10* (2025.01)
*H10D 62/832* (2025.01)
*H10P 30/20* (2026.01)

(52) U.S. Cl.

CPC ....... *H10D 30/668* (2025.01); *H10D 62/8325* (2025.01); *H10P 30/222* (2026.01); *H10D 62/115* (2025.01); *H10D 62/116* (2025.01)

(56) References Cited

U.S. PATENT DOCUMENTS

| | | | | |
|---|---|---|---|---|
| 7,944,018 | B2 | 5/2011 | Anderson et al. | |
| 8,114,751 | B2 | 2/2012 | Ishiguro et al. | |
| 8,129,252 | B2 | 3/2012 | Anderson et al. | |
| 8,716,829 | B2 | 5/2014 | Anderson et al. | |
| 8,736,019 | B2 | 5/2014 | Anderson et al. | |
| 8,963,239 | B2 | 2/2015 | Anderson et al. | |
| 2002/0008234 | A1 | 1/2002 | Emrick et al. | |
| 2002/0153594 | A1* | 10/2002 | Lipkin | H10D 8/051 257/E29.328 |
| 2003/0036247 | A1* | 2/2003 | Eriksen | H01L 21/76254 438/455 |
| 2003/0151051 | A1* | 8/2003 | Johnson | H01L 21/2007 257/77 |
| 2004/0009649 | A1 | 1/2004 | Kub et al. | |
| 2004/0016962 | A1 | 1/2004 | Okumura et al. | |
| 2004/0150040 | A1 | 8/2004 | Nitta et al. | |
| 2005/0269660 | A1 | 12/2005 | Singh | |
| 2006/0169987 | A1* | 8/2006 | Miura | H10P 14/24 257/E21.127 |
| 2007/0087525 | A1 | 4/2007 | Chen et al. | |
| 2008/0142837 | A1 | 6/2008 | Sato et al. | |
| 2008/0258239 | A1 | 10/2008 | Ishiguro | |
| 2008/0296617 | A1* | 12/2008 | Mishra | H10D 30/66 438/455 |
| 2009/0278169 | A1 | 11/2009 | Hayashi et al. | |
| 2010/0133550 | A1* | 6/2010 | Zhang | C23C 16/325 257/77 |
| 2010/0327291 | A1* | 12/2010 | Preble | C30B 25/02 257/E29.089 |
| 2011/0006310 | A1* | 1/2011 | Nagasawa | H10D 8/60 257/77 |
| 2011/0220915 | A1 | 9/2011 | Edgar et al. | |
| 2013/0187224 | A1 | 7/2013 | Verma et al. | |
| 2014/0264582 | A1 | 9/2014 | Anderson et al. | |
| 2018/0366569 | A1* | 12/2018 | Zeng | H10D 30/473 |
| 2019/0165134 | A1 | 5/2019 | Diaz et al. | |
| 2021/0119039 | A1 | 4/2021 | Miida et al. | |
| 2022/0293737 | A1* | 9/2022 | Han | H01L 21/324 |
| 2023/0120346 | A1 | 4/2023 | Ghyselen et al. | |

* cited by examiner

SEMICONDUCTOR DEVICE AND METHOD OF FORMING RADIATION HARDENED SUBSTANTIALLY DEFECT FREE SILICON CARBIDE SUBSTRATE

CLAIM TO DOMESTIC PRIORITY

The present application is a continuation-in-part of U.S. patent application Ser. No. 17/811,639, filed Jul. 11, 2022, which claims the benefit of U.S. Provisional Application No. 63/260,614, filed Aug. 26, 2021, which applications are incorporated herein by reference. The present application further claims the benefit of U.S. Provisional Application No. 63/260,614, filed Aug. 26, 2021, which application is incorporated herein by reference.

FIELD OF THE INVENTION

The present invention relates in general to a semiconductor device and, more particularly, to a semiconductor device and method of forming a radiation hardened (rad hard) substantially defect-free silicon carbide substrate.

BACKGROUND OF THE INVENTION

Semiconductor devices are commonly found in modern electrical products. Semiconductor devices vary in the number and density of electrical components. Discrete semiconductor devices generally contain one type of electrical component, e.g., a light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, interface circuits, and other signal processing circuits.

With respect to the power MOSFET, such devices have been made with a super-junction structure. Advances have been made to merge micro-electrical-mechanical system (MEMS) layer transfer and super-junction technology. Super-junction has been an important development for power devices since the introduction of the insulated gate bipolar transistor (IGBT) in the 1980s. Super-junction has extended the well-known theoretical study on the limit of silicon in high-voltage devices. MEMS super-junction reduces manufacturing cost by merging MEMS processing techniques into CMOS processes to build super-junction metal oxide semiconductor (SJMOS) structures.

Super-junction can be challenging to realize in practice, due to the requirement of forming three-dimensional device structures with a high aspect ratio. SJMOS addresses the super-junction manufacturing and cost problem through a low-cost, commercially viable MEMS layer transfer and deep reactive ion etch fabrication technology. The comparison between multiple-epi and the merger of MEMS based SJMOS devices is differentiated by the number of mask layers. There can be twenty or more mask layers used in the manufacture of multi-epi, while SJMOS uses nine mask layers.

Many semiconductor devices use a substrate made at least in part with silicon carbide (SiC) semiconductor material, such as 4H and 6H SiC. The SiC semiconductor layer or substrate provides some useful advantages, such as high breakdown voltage, high speed, reduced switching losses, high power density, high temperature, better heat dissipation, and increased bandwidth capability. However, forming the SiC layer on a Si layer produces a heterointerface between two dissimilar materials with different lattice structures and different coefficients of thermal expansion (CTE). The heterointerface causes stress during temperature cycling and leads to defects in the SiC layer, including triangle defects, carrot defects, surface pits, step bunching, micro-twins, stacking faults, basal plane dislocations (BPD), micropipes (MP), threading screw dislocations (TSD), and threading edge dislocations (TED). Many attempts have been made to reduce the defect density in the SiC substrate. For example, attempts have been made to accurately control surface chemistry during the epitaxial growth. In other examples, attempts have been made to optimize etch time prior to epitaxy, to optimize the shape of the wafers via optimized crystal growth, wafering, and polishing processes, and to make use of buffer-layers, high temperature processes, intrinsic strain reduction, and patterned Si-substrates when growing SiC or 3C—SiC heteroepitaxy. The work done to date has focused on reducing defects in the SiC substrate, which has only served to increase manufacturing costs, while continuing to produce SiC substrates with high defect densities and low yield.

It is also desirable to make the substantially defect-free SiC substrate radiation hardened for aerospace applications. When semiconductor devices, such as power MOSFETs, are utilized in the upper atmosphere or in space, e.g., on rockets, satellites, space stations, or the like, these devices must maintain reliability despite the presence of potentially damaging cosmic rays and other types of radiation, i.e., the devices must be rad hard. The rad hard requirement also applies to other environments where the semiconductor device may be subjected to radiation doses above and beyond typical working conditions. Reliability parameters for such devices and conditions often refer to catastrophic events such as single event burnout (SEB) and single event gate rupture (SEGR). The most sensitive parts of the MOSFET tends to be the oxide layers and the silicon-oxide interfaces. The power MOSFET should be hardened against exposure to radiation in aerospace applications.

One previous solution for increasing reliability includes providing thicker oxide layers. The thicker oxide layer reduces the radiation-induced electric field and makes the device able to withstand a single event effect (SEE). However, the thicker oxide makes the overall device weaker when considering the effects from a total ionizing dose (TID). The oxide layer traps charges and interface trap density increase as the total radiation exposure goes up, driving the threshold voltage lower and increasing the threshold leakage current.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1:
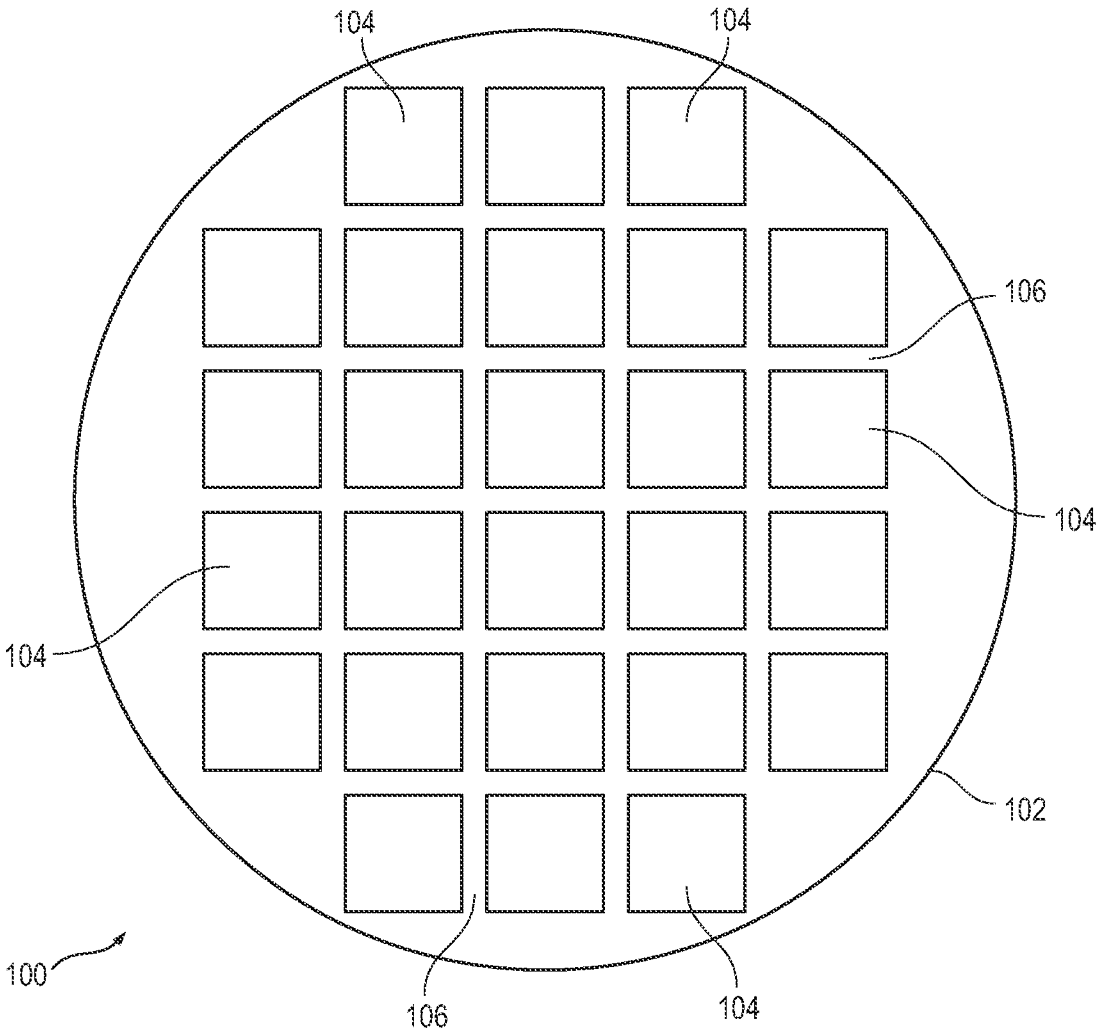
FIG. 1 illustrates a semiconductor wafer with a plurality of semiconductor die.

FIG. 1 shows semiconductor wafer or substrate 100 with a base substrate material 102, such as silicon (Si), SiC, cubic silicon carbide (3C—SiC), germanium, aluminum phosphide, aluminum arsenide, gallium arsenide, gallium nitride, indium phosphide, diamond, and all families of III-V and II-VI semiconductor materials for structural support. In one embodiment, substrate 100 includes a nearly or substantially defect-free SiC substrate, as described in FIGS. 2-12. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Semiconductor die 104 can be a vertical or lateral power MOSFET with gate and source terminals on a first surface of the die and drain terminal on a second surface opposite the first surface of the die. Semiconductor die 104 can be contained in a semiconductor package, such as TO220, T0247, decawat package (DPAK), double decawat package (D2PAK), TSON, micro leadframe package (MLP), dual flat no-leads (DFN), and other packages for vertical discrete devices or lateral chip scale up-drain packages.

Figure 2A:
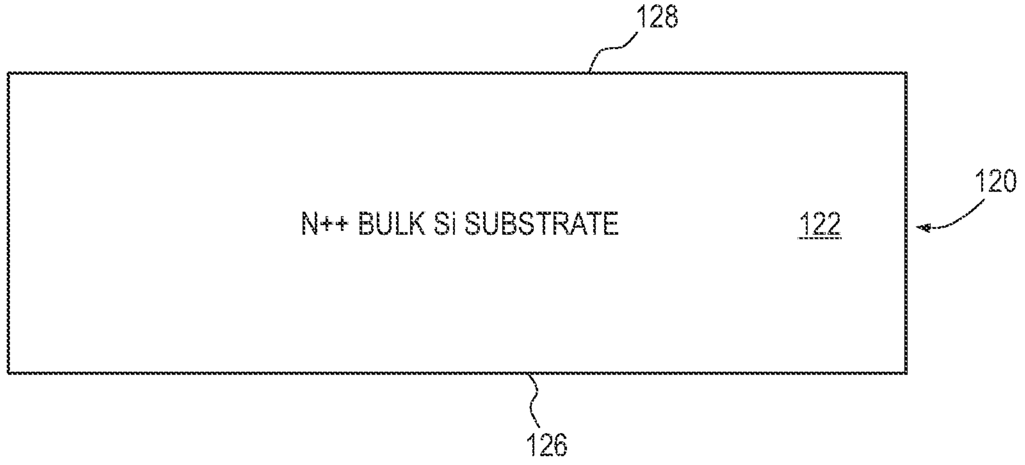
FIGS. 2*a*-2*g* illustrate a process of forming a sacrificial heteroepitaxy interface to provide a substantially defect-free SiC substrate.
Figure 2B:
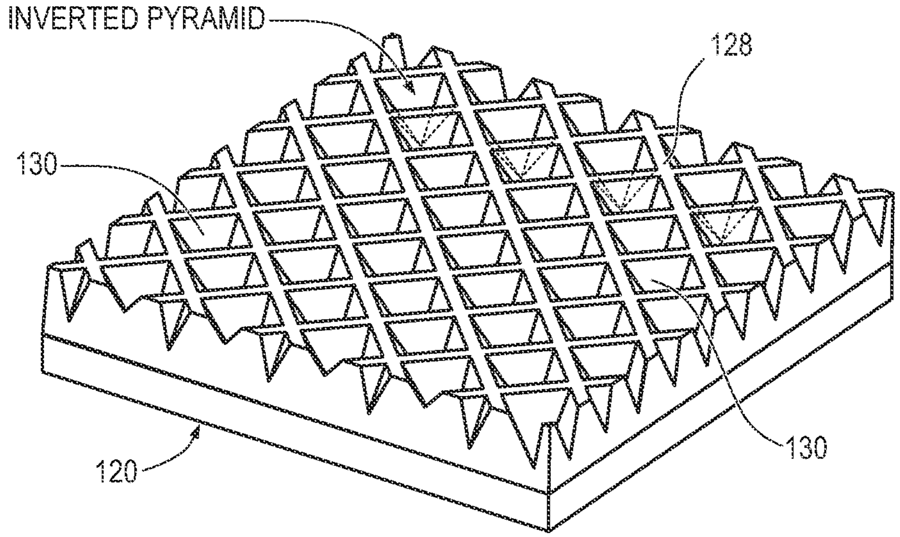

FIGS. 2*a*-2*g* illustrate a process of forming a sacrificial heteroepitaxy interface to provide a substantially defect-free SiC or 3C—SiC substrate or layer. FIG. 2*a* illustrates substrate 120 containing a base semiconductor material 122, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 120 contains N++ bulk Si with a thickness of about 350 micrometers (μm). Substrate 120 includes a first surface 126 and second surface 128 opposite the first surface 126. Substrate 120 is a sacrificial, inverted pyramid patterned, compliant, bulk Si substrate. Substrate 120 is sacrificial as it will later be removed. Surface 128 of substrate 120 is an inverted pyramid patterned, textured surface, as shown in FIG. 2*b*. Small inverted pyramid-shaped voids 130 are patterned and etched into surface 128 to create structured substrate 120.

The structured substrate 120 comes from the consideration that the stacking faults (SF) lie on (111) planes and can interact with each other, stopping the propagation. With two SFs laying, for example, in the (111) and (11-1) planes, the SFs can cross, and the structure is able to stop the propagation of one or even both SFs to improve the crystalline quality of the film surface because the SFs remain buried in the epilayer. The rate of SF annihilation is inversely related to SF density, however, by means of the inverted pyramid pattern, allowing for a significant drop in SF concentration just within a few microns from the heterointerface allows that defect density to decrease with increasing epitaxial layer thickness. The unique pyramid shape can concentrate SFs in small areas, enhancing the phenomenon of SF annihilation.

Figure 2C:
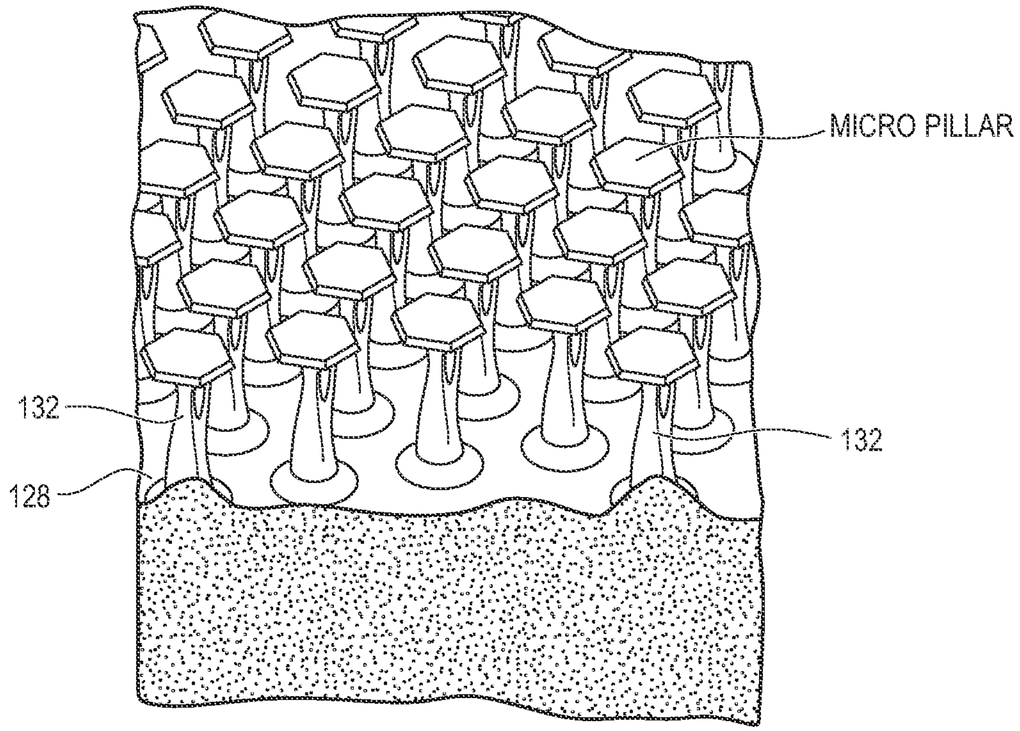
Figure 2D:
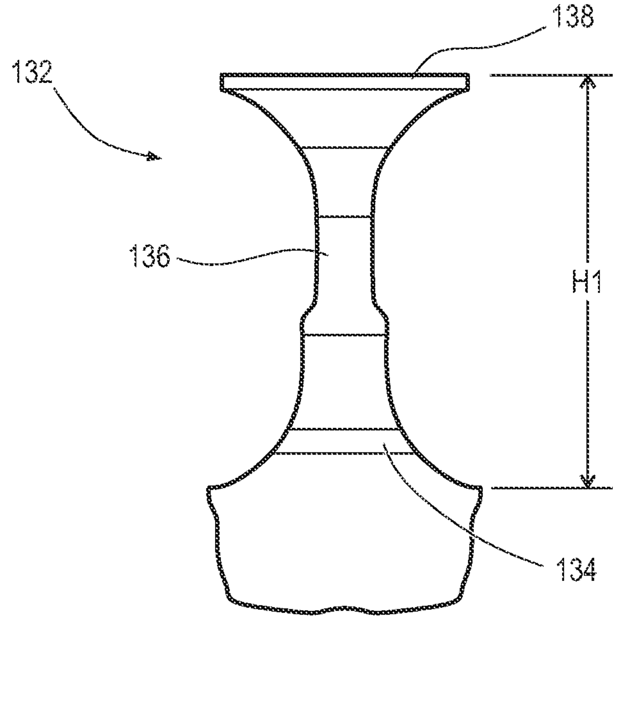

In another embodiment shown in FIG. 2*c*, a plurality of micropillars 132 is patterned and formed into hexagonal arrays on surface 128 of substrate 120 by a dry etching process. Micropillars 132 can be made with Si. FIG. 2*d* illustrates one micropillar 132 with base 134, stem 136, and pedestal 138. The height H1 of micropillar 132 is about 9.35 μm. Pedestal 138 of one micropillar 132 may contact another pedestal of an adjacent micropillar. The compliant substrate 120 with micropillars 132 releases the stress developed in 3C—SiC grown on Si substrate, due to the lattice mismatch and the different CTE between 3C—SiC and Si.

Figure 2E:
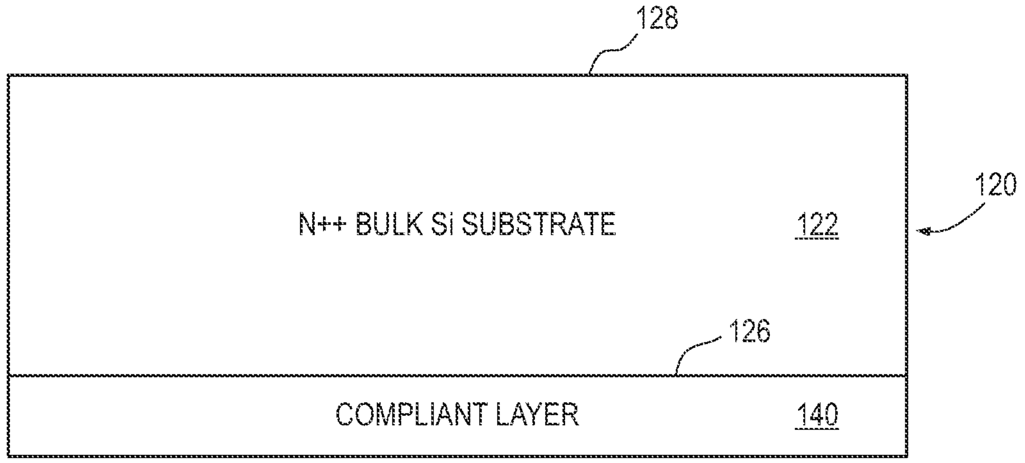

In FIG. 2*e*, compliant layer 140 is deposited on surface 126 using physical vapor deposition (PVD), chemical vapor deposition (CVD), plasma enhanced chemical vapor deposition (PECVD), low pressure chemical vapor deposition (LPCVD), tetraethylorthosilicate (TEOS), or other suitable deposition process. In one embodiment, compliant layer 140 includes a polysilicon or oxide layer formed using LPCVD to a thickness of 2-3 μm.

Figure 2F:
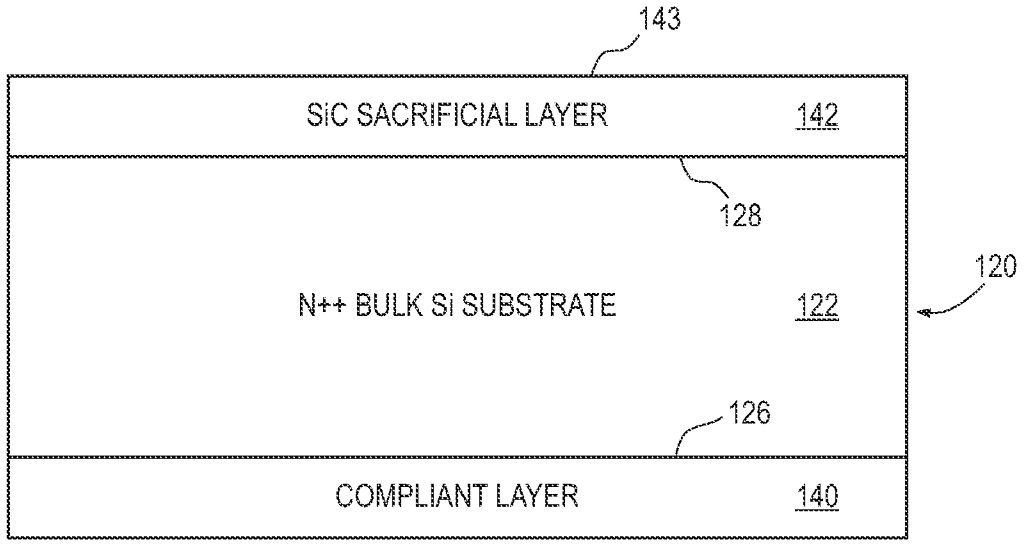

In FIG. 2*f*, substrate 120 and compliant layer 140 provide the foundation to grow a desired substantially defect-free SiC or 3C—SiC substrate. In particular, a thin film sacrificial layer 142 is grown on the inverted pyramid patterned and textured growth (or micro-pillar 132) surface 128. Sacrificial layer 142 is a heteroepitaxy, high defect density semiconductor layer. In one embodiment, sacrificial layer 142 is a SiC or 3C—SiC layer formed using a hot wall CVD chamber or reactor to a thickness of 3-6 μm. The heteroepitaxy growth involves dissimilar materials, e.g., SiC or 3C—SiC sacrificial layer 142 on Si substrate 120. In the hot wall CVD reactor, heat is radiated to the substrate from the chamber walls to achieve a uniform temperature distribution and uniform coating thickness. The reaction uses multiple steps at varying temperatures, including carbonization step at 1100° C. and SiC growth at 1380° C.

Figure 2G:
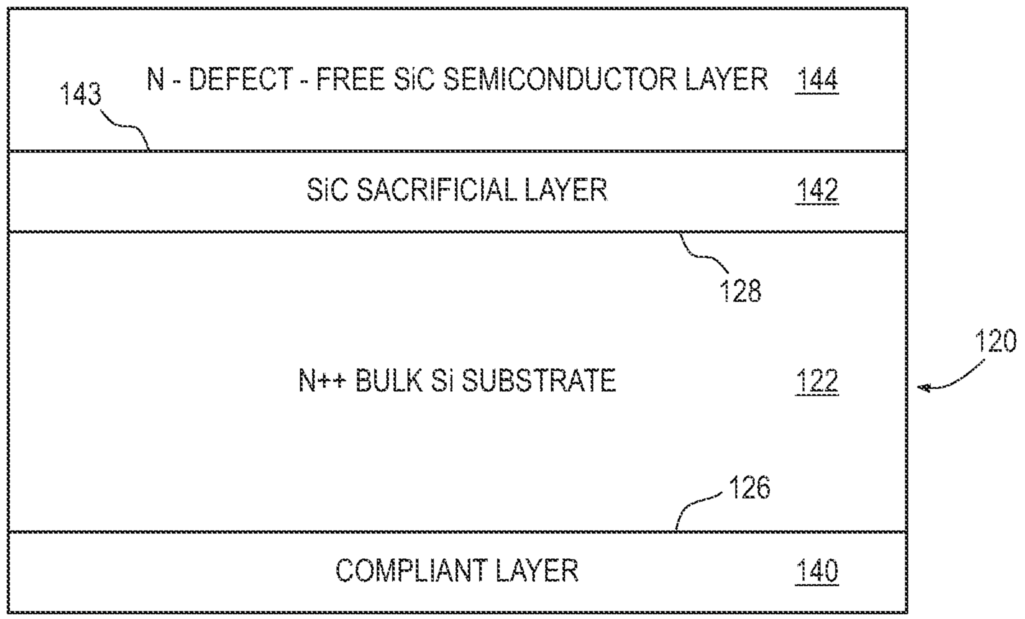

In FIG. 2*g*, semiconductor layer 144 is epitaxially grown over surface 143 of sacrificial layer 142. In one embodiment, semiconductor layer 144 is implanted with n-type dopant, e.g., phosphorus at 7.3e14 atoms/$cm^3$ to form an N− SiC epi or N− 3C—SiC epi layer with a thickness of 30-60 μm.

An important structure to avoid bow warp has an epitaxial growth as follows. Six 3C—SiC on Si epi wafers exhibit growth on 1.0 mm by 152.4 mm Si substrates to ensure ≤250 μm of wafer bow over the total wafer diameter, growth of 4.0 μm of 1e18 n-type doped 3C—SiC (buffer layer), and growth of 6.0 μm of 2e16 n-type doped 3C—SiC (device layer) on the buffer layer.

Of particular relevance is that the contact between semiconductor material 122 (Si) and semiconductor layer 142 (SiC or 3C—SiC) involves a heterointerface between two dissimilar materials with different lattice structures and different CTE. The growth of the SiC or 3C—SiC semiconductor layers 144 over Si substrate 120, cycling over a temperature range, creates stress and strain at the heteroboundary around surface 128, which results in defects in or around the interface regions. The density of defects can be significant at the interface region proximate to surface 128, hence semiconductor layer 142 is characterized as having a high defect density. Small inverted pyramid-shaped voids 130, or micropillars 132, formed in surface 128 operate to self-annihilate or otherwise relieve the stress and associated expansion of defects. With compliant layer 140, substrate 120 softens during extreme temperature cycles in formation of the SiC or 3C—SiC semiconductor layer 142 so the stress and strain inherent to heteroepitaxy growth can reside in, and are substantially limited to, substrate 120 and semiconductor layer 142. Defects are confined to about 3-6 μm from surface 128 into semiconductor layer 142 and about 3-6 μm from surface 128 into semiconductor material 122. The SiC or 3C—SiC semiconductor layer 144 is nearly defect-free, because the defects substantially occur in and are confined to sacrificial semiconductor layer 142.

Figure 3A:
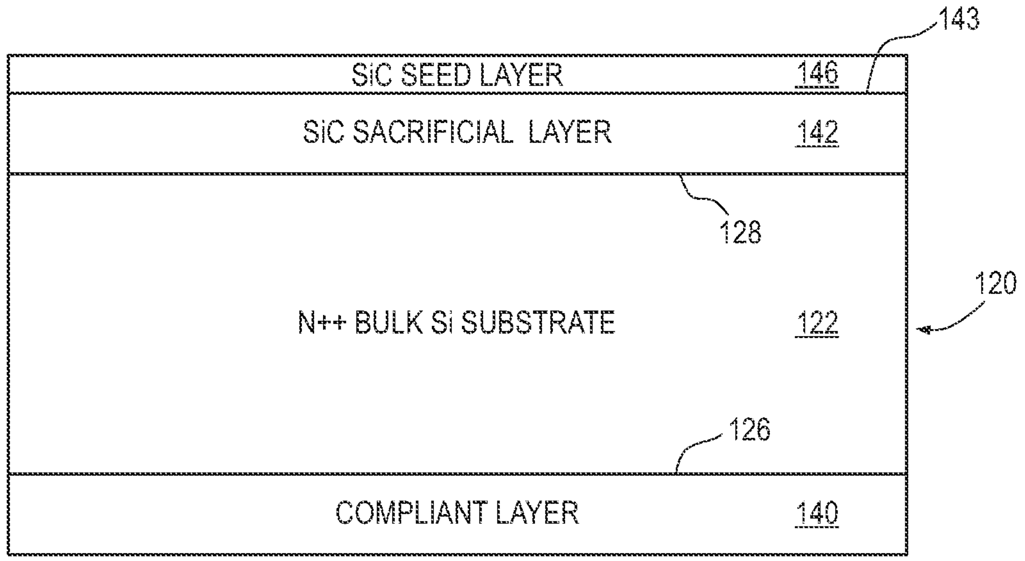
FIGS. 3*a*-3*d* illustrate another process of forming a substantially defect-free SiC substrate.

In another embodiment, continuing from FIG. 2*f* and as shown in FIG. 3*a*, seed layer 146 is epitaxially grown on surface 143 of sacrificial layer 142 at a temperature less than the melting point of base Si semiconductor material 122, i.e., about 1275-1414° C. In one embodiment, the temperature is about 1350° C. Seed layer 146 can be SiC or 3C—SiC with a thickness of 10-50 μm. In this case, sacrificial layer 142 is SiC or 3C—SiC.

Figure 3B:
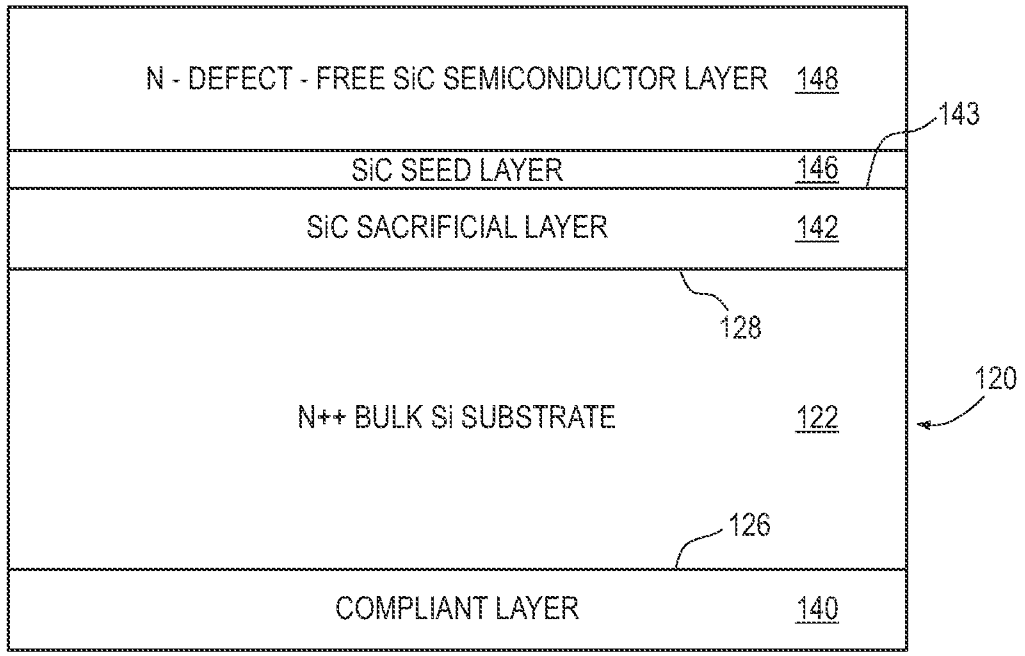

In FIG. 3*b*, semiconductor layer 148 is epitaxially grown over seed layer 146 to a thickness of 200 μm, at a temperature greater than the melting point of base Si semiconductor material 122 and compliant layer 140, i.e., above 1414° C. In one embodiment, the temperature is about 1700° C. Semiconductor layer 148 is implanted with n-type dopant, e.g., phosphorus at 7.3e14 atoms/$cm^3$ to form an N− SiC epi or N− 3C—SiC epi layer with a thickness of 30-60 μm. The formation of semiconductor layer 148 substantially absorbs seed layer 146.

Figure 3C:
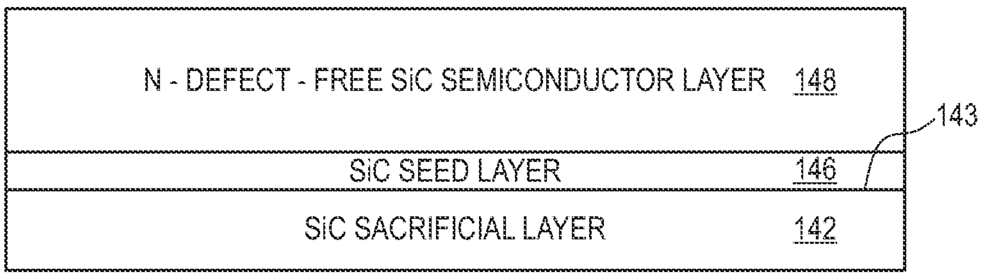

While SiC sacrificial layer 142 has a high defect density, seed layer 146 and semiconductor layer 148 have a relatively low defect density, i.e., substantially defect-free, because the defects have been confined to the SiC sacrificial layer. Using the higher melting point of SiC material as compared to Si material, a substantial portion if not all of the Si material (substrate 120 and compliant layer 140) is melted away, as shown in FIG. 3*c*. For example, Si material of substrate 120 and compliant layer 140 are being removed above 1500° C.

Figure 3D:

In FIG. 3*d*, SiC sacrificial layer 142 and any remaining portion of seed layer 146 is removed by a grinding operation, deleting any remnant of the heterointerface including defects in the sacrificial layer, leaving nearly or substantially defect-free SiC material in semiconductor layer 148. Any CTE mismatch and lattice mismatch would have been reduced or eliminated. The SiC or 3C—SiC semiconductor layer 148 is nearly or substantially defect-free, because the defects have been confined to and removed in the Si material and SiC sacrificial layer 142.

Figure 4A:
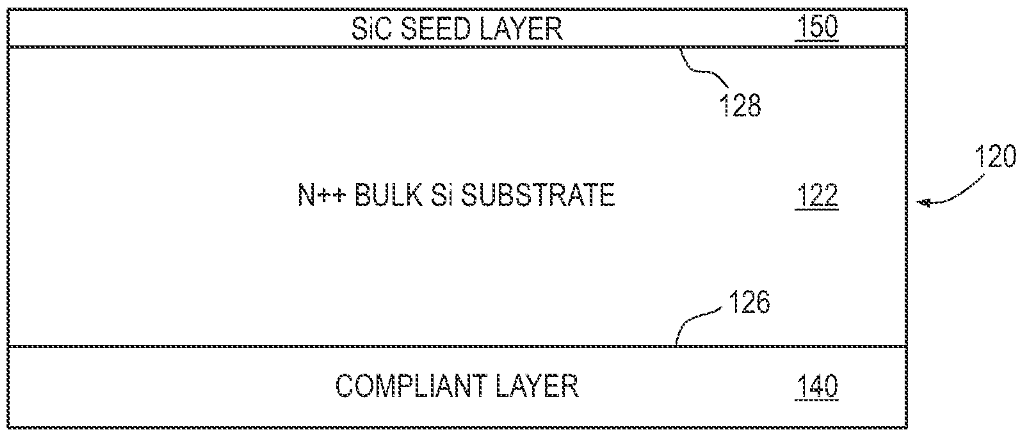
FIGS. 4*a*-4*e* illustrate another process of forming a substantially defect-free SiC substrate.

In another embodiment, continuing from FIG. 2*e* and as shown in FIG. 4*a*, seed layer 150 is epitaxially grown on surface 128 of substrate 120 at a temperature less than the melting point of base Si semiconductor material 122, i.e., about 1275-1414° C. Seed layer 150 can be SiC or 3C—SiC with a thickness of 10-50 μm.

Figure 4B:
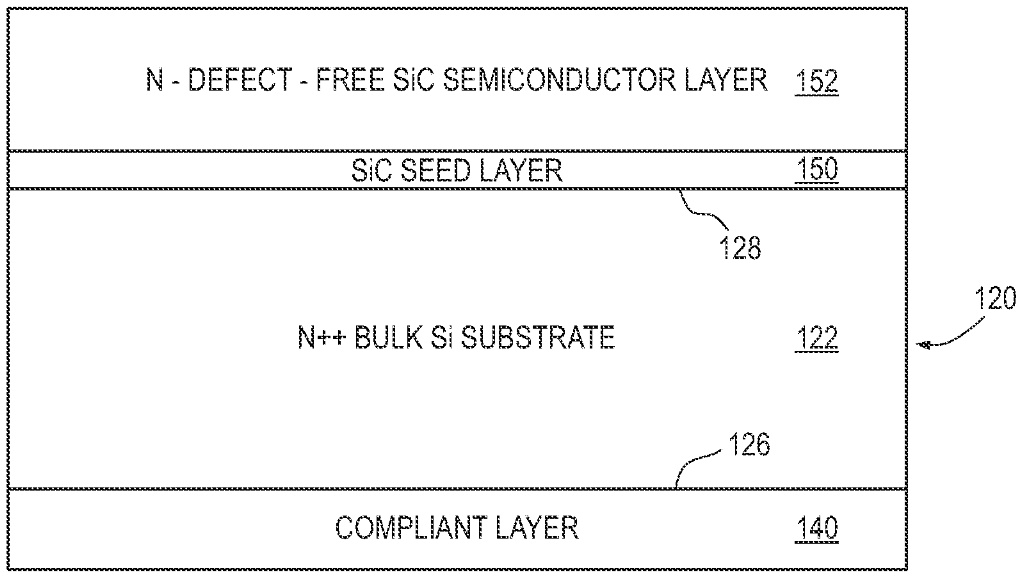

In FIG. 4*b*, semiconductor layer 152 is epitaxially grown over seed layer 150. In one embodiment, semiconductor layer 152 is implanted with n-type dopant, e.g., phosphorus at 7.3e14 atoms/$cm^3$ to form an N− SiC epi or N− 3C—SiC epi layer with a thickness of 30-60 μm using hot wall CVD epitaxial growth. Si substrate 122 will contain a high defect density region proximate to surface 128 to a depth of 4-5 μm. The formation of semiconductor layer 152 substantially absorbs seed layer 150.

Figure 4C:
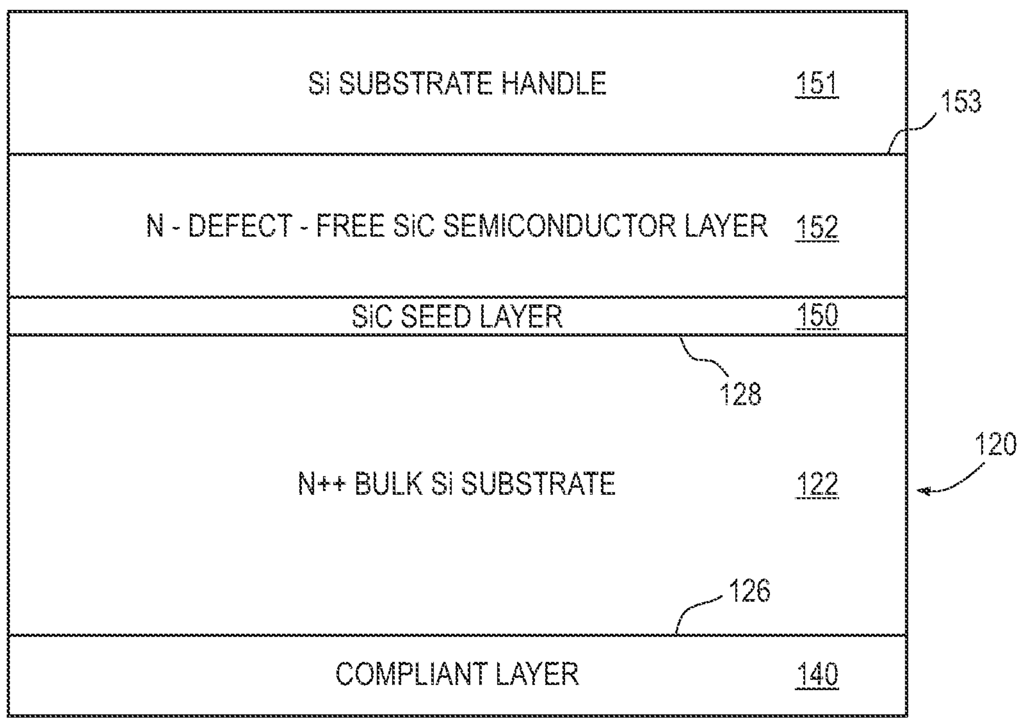
Figure 4D:
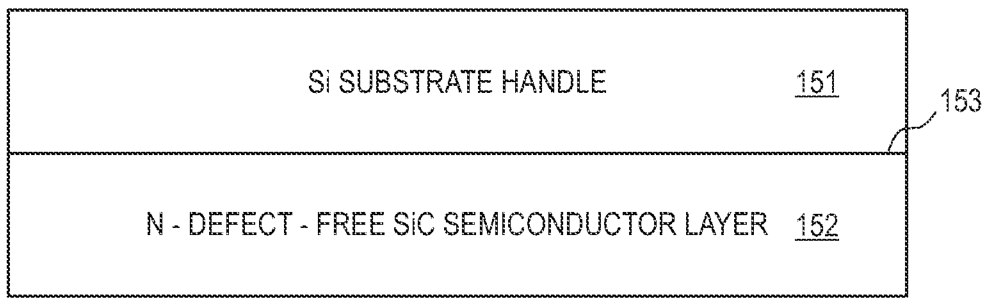
Figure 4E:

In FIG. 4*c*, Si substrate 151 is bonded to surface 153 of SiC semiconductor layer 152. Si substrate 151 operates a support base or handle for a grinding operation. In FIG. 4*d*, seed layer 150, Si substrate 122, and compliant layer 140 are removed by a grinding operation, deleting any remnant of the heterointerface including defects in the Si substrate, and leaving nearly defect-free SiC material in semiconductor layer 152. In FIG. 4*e*, Si substrate handle 151 is removed leaving nearly defect-free SiC material in semiconductor layer 152.

Alternatively, semiconductor layer 152 is epitaxially grown over seed layer 150 to a thickness of 200 μm, at a temperature greater than the melting point of base Si semiconductor material 122 and compliant layer 140, i.e., above 1414° C. In one embodiment, the temperature is about 1700° C. Semiconductor layer 152 is implanted with n-type dopant, e.g., phosphorus at 7.3e14 atoms/$cm^3$ to form an N− SiC epi or N− 3C—SiC epi layer with a thickness of 30-60 μm.

While N++ bulk Si substrate 122 has a high defect density region proximate to surface 128 to a depth of 4-5 μm, seed layer 150 and semiconductor layer 152 have a relatively low defect density, i.e., substantially defect-free, because the defects have been confined to the bulk Si substrate. Using the higher melting point of SiC material as compared to Si material, a substantial portion if not all of the Si material (substrate 120 and compliant layer 140) is melted away, deleting any remnant of the heterointerface including defects in the Si substrate, and leaving nearly defect-free SiC material in semiconductor layer 152. For example, Si material of substrate 120 and compliant layer 140 are being removed above 1500° C. Any remaining portion of seed layer 150 is removed by a grinding operation, leaving nearly defect-free SiC material in semiconductor layer 152, similar to FIG. 4*e*.

Figure 5A:
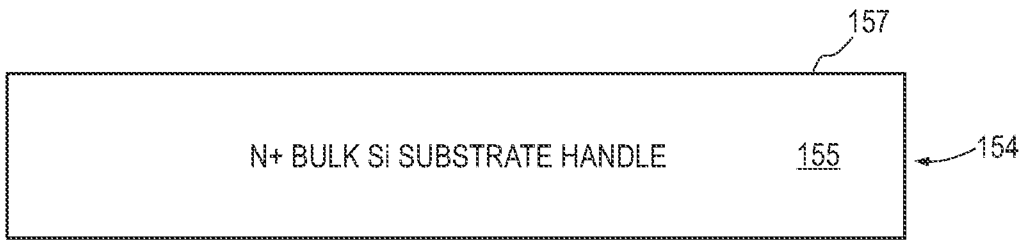
FIGS. 5*a*-5*d* illustrate a process of forming a semiconductor layer over a substrate.

FIG. 5*a* illustrates substrate 154 containing a base semiconductor material 155, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 154 is a heavily doped N+ Si substrate with a thickness of 700 μm.

Figure 5B:
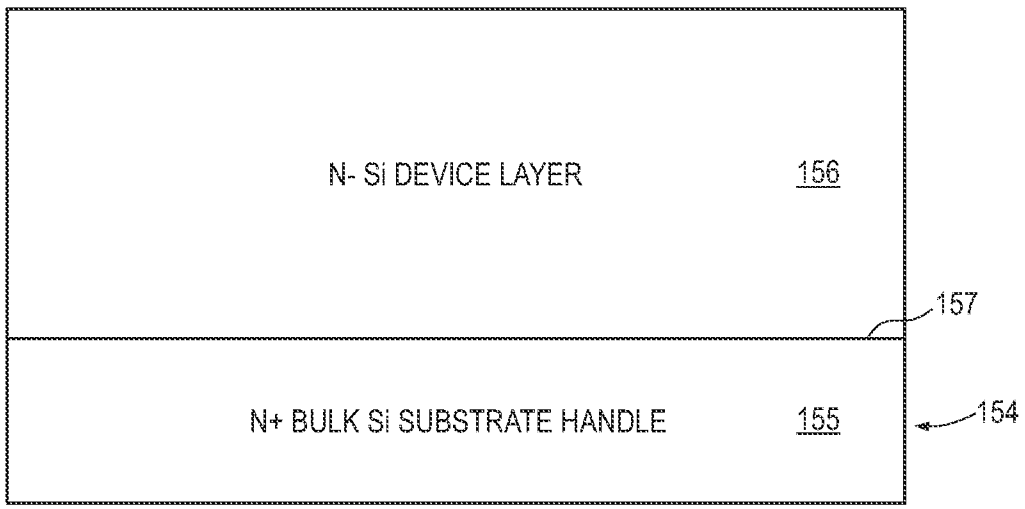

In FIG. 5*b*, semiconductor layer 156 is epitaxially grown on surface 157 of substrate 154. The epitaxial growth or deposition occurs in a reaction chamber at a temperature of about 750-1200° C. In one embodiment, semiconductor layer 156 is doped with phosphorus at 1e13 to 1e17 atoms/$cm^3$ to form an N− Si epi layer with a thickness of 50-150 μm. Semiconductor layer 156 operates as a device layer designated for formation of a semiconductor device, such as a power MOSFET or diode.

Figure 5C:
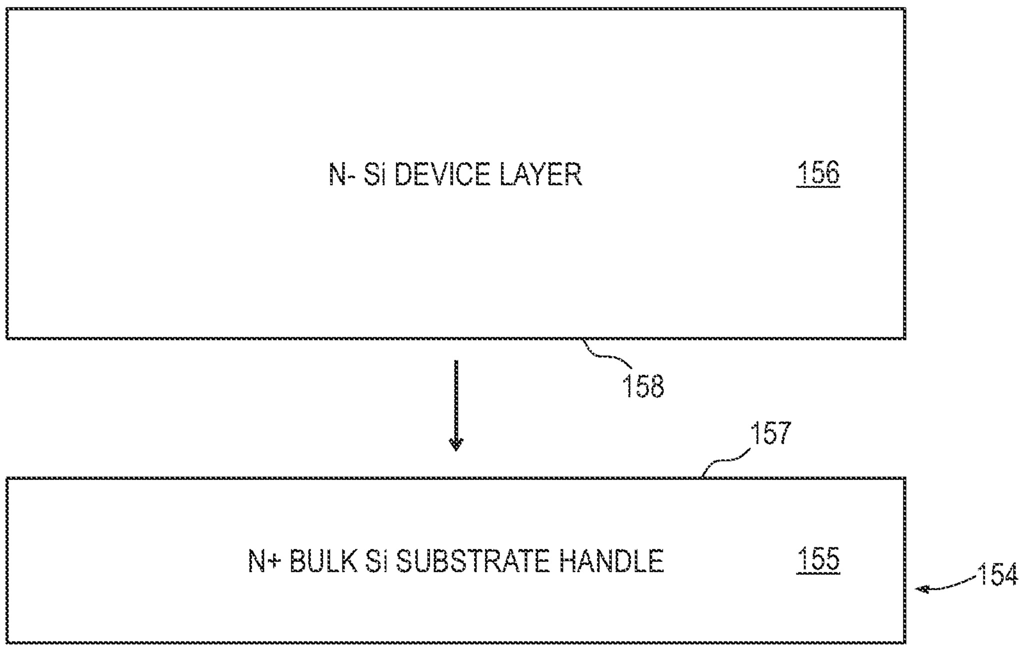
Figure 5D:
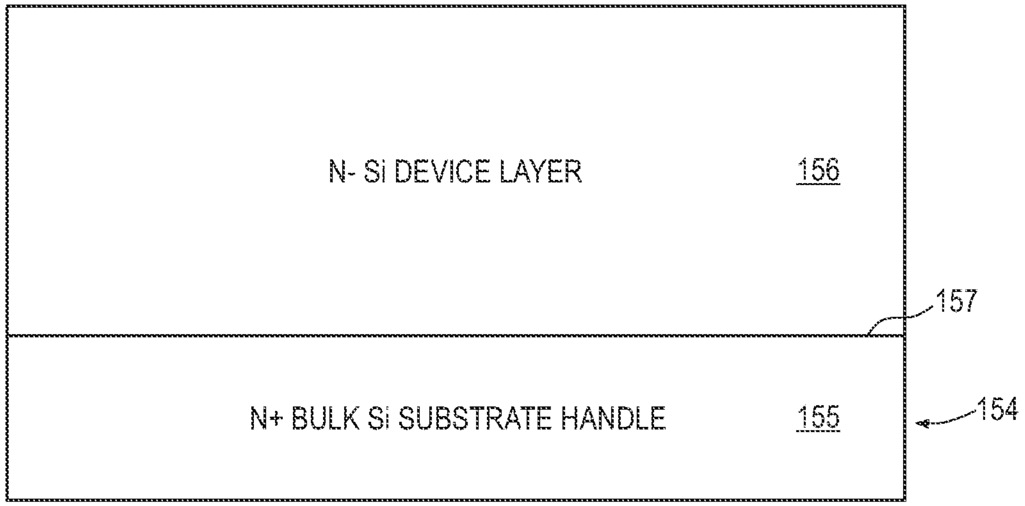

Alternatively, semiconductor layer 156 can be joined to substrate 154 using a high temperature anneal, fusion bonding, plasma activated direct wafer bonding (DWB), or other DWB process. In FIG. 5*c*, semiconductor layer 156 is disposed over surface 157 of substrate 154. Surface 158 of semiconductor layer 156 and surface 157 of substrate 154 are planarized, polished, and cleaned to be flat and smooth, prior to bonding. The lattice structures of semiconductor layer 156 and substrate 154 can be aligned to optimize adhesion. Water molecules can be applied to surfaces 157 and 158 to aid in the bonding process. Surface 158 of semiconductor layer 156 is brought into contact with surface 157 of substrate 154. DWB is accomplished with chemical bonds and intermolecular interactions at temperature, including van der Waals forces, hydrogen bonds, and covalent bonds, between surface 157 and surface 158. DWB temperatures range from ambient to 100's ° C. FIG. 5*d* shows semiconductor layer 156 direct wafer bonded to surface 157 of substrate 154.

Figure 6A:
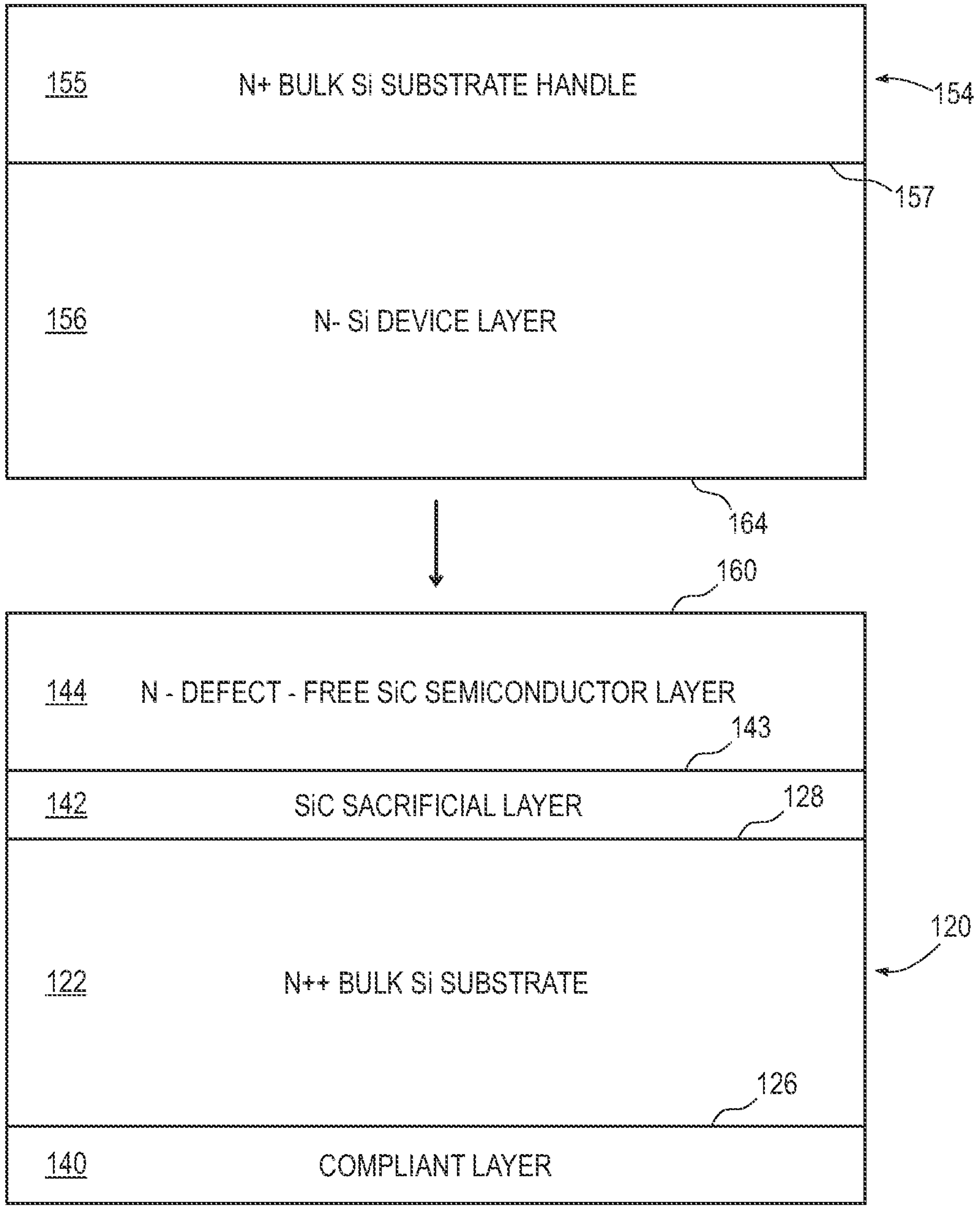
FIGS. 6*a*-6*c* illustrate a process of bonding the structure from FIG. 5*d* to the structure from FIG. 2*g;*
Figure 6B:
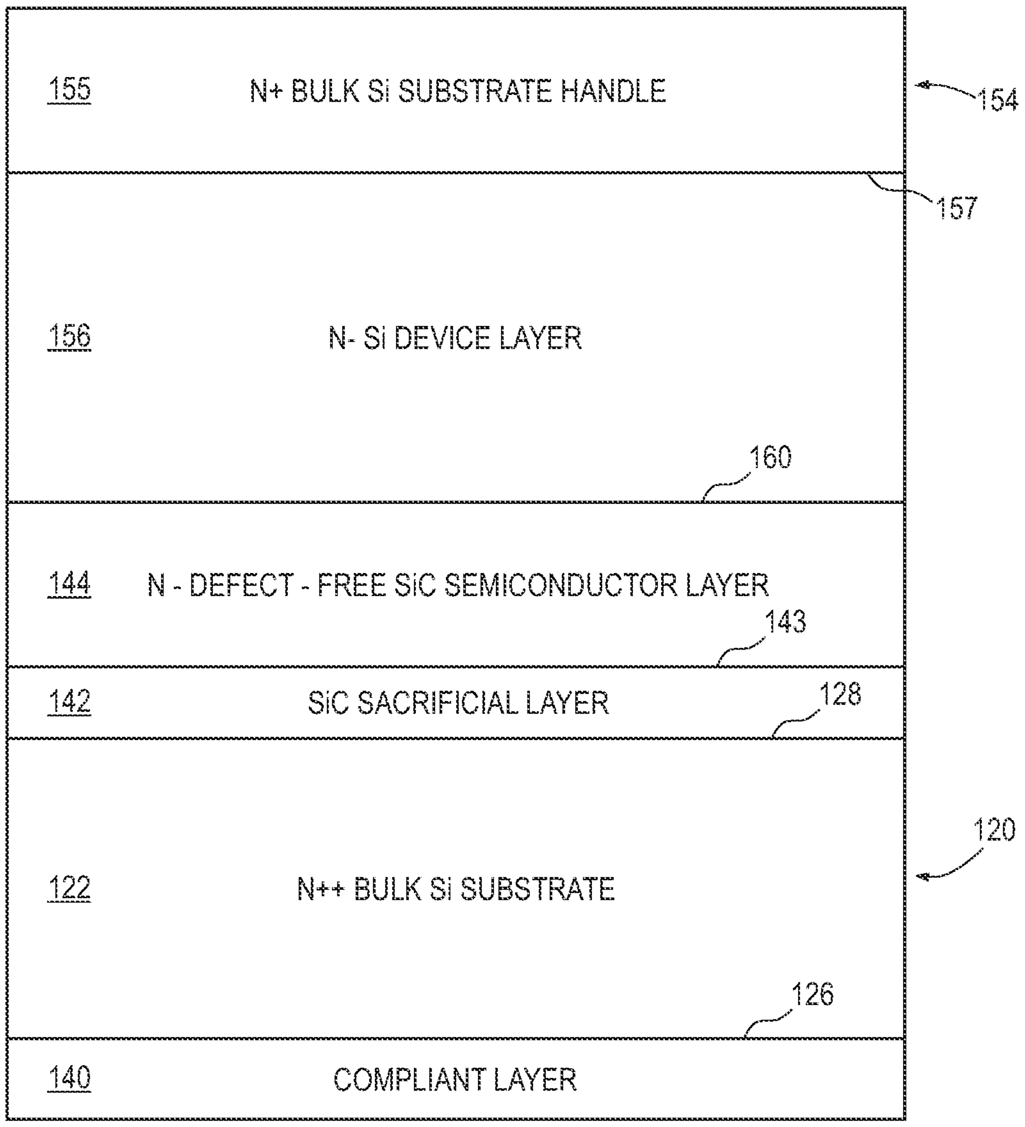
Figure 6C:
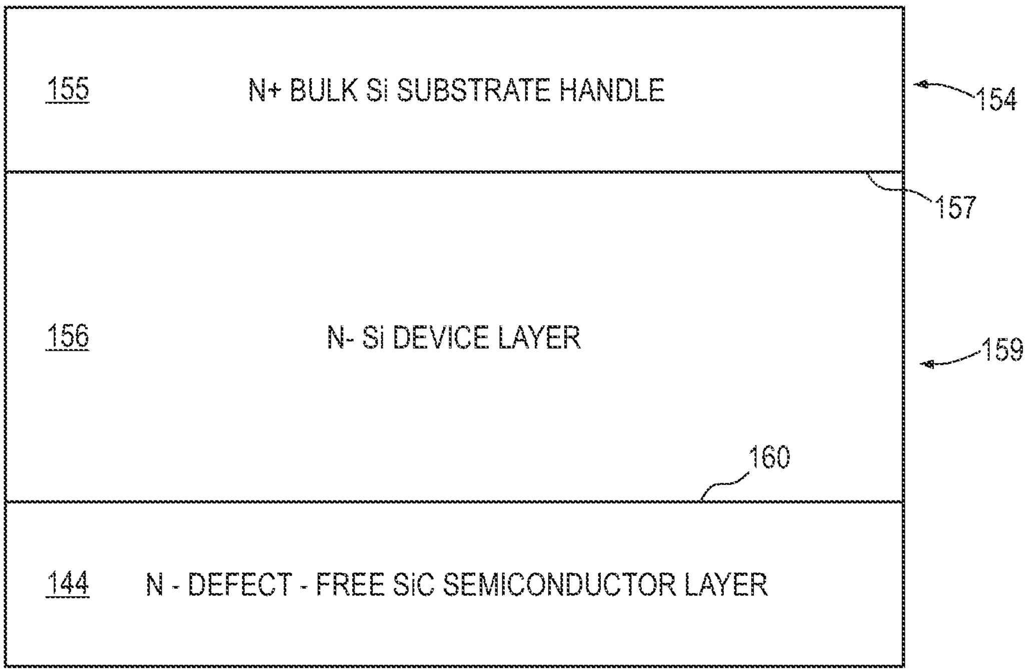

In one embodiment shown in FIGS. 6*a*-6*c*, the combination of substrate 154 and semiconductor layer 156 from FIG. 5*b* or 5*d* is joined to semiconductor layer 144 from FIG. 2*g* using a high temperature anneal, fusion bonding, plasma activated DWB, or other DWB process. The semiconductor layers shown in the figures are not drawn to scale.

FIG. 6*a* illustrates the combination of substrate 154 and semiconductor layer 156 from FIG. 5*b* or 5*d* disposed over surface 160 of semiconductor layer 144. Surface 160 of semiconductor layer 144 and surface 164 of semiconductor layer 156 are planarized, polished, and cleaned to be flat and smooth, prior to bonding. The lattice structures of semiconductor layer 156 and semiconductor layer 144 can be aligned to optimize adhesion. Water molecules can be applied to surfaces 160 and 164 to aid in the bonding process. Surface 164 of semiconductor layer 156 is brought into contact with surface 160 of semiconductor layer 144. DWB is accomplished with chemical bonds and intermolecular interactions at temperature, including van der Waals forces, hydrogen bonds, and covalent bonds, between surface 160 and surface 164. DWB temperatures range from ambient to 100's ° C.

FIG. 6*b* shows semiconductor layer 156 direct wafer bonded to surface 160 of semiconductor layer 144. Surface 160 of semiconductor layer 144 is substantially oxide/defect-free Si face to enable direct covalent bonding to Si face of surface 164 of semiconductor layer 156. The interface between semiconductor layer 144 and semiconductor layer 156 exhibits a strong bond with little or no defects in the crystalline structure.

In FIG. 6*c*, compliant layer 140, sacrificial substrate 120, and sacrificial semiconductor layer 142 are removed by chemical etching, CMP, mechanical peel-off, mechanical grinding, thermal bake, UV light, or wet stripping, leaving N+ Si substrate 154, N− semiconductor device layer 156, and substantially defect-free N− SiC or 3C—SiC semiconductor layer 144. The removal of the sacrificial layers 120 and 142 takes away or eliminates the defects formed by the heteroepitaxial interface and associated lattice mismatch and different CTEs of the dissimilar materials. The above process allows for the formation of defects at the heteroepitaxial interface but confines the defects to the sacrificial layers and then removes the defective material leaving nearly or substantially defect-free semiconductor layer 144 in engineered substrate 159.

Figure 7A:
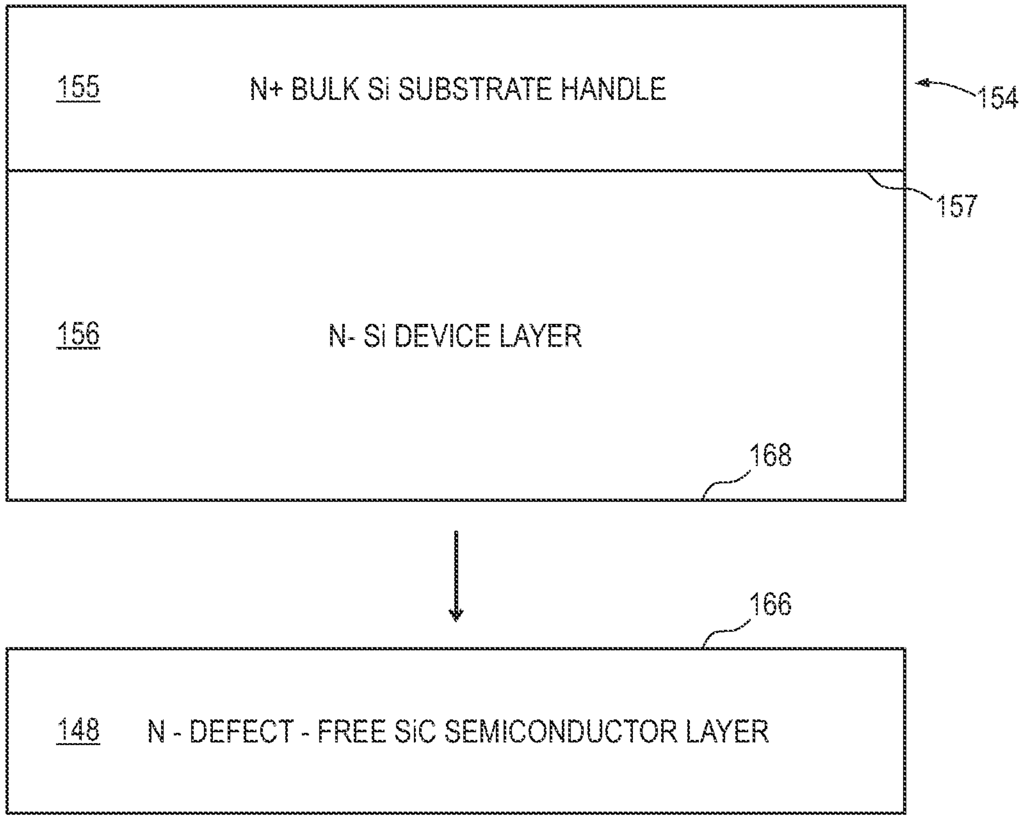
FIGS. 7*a*-7*b* illustrate a process of bonding the structure from FIG. 5*d* to the structure from FIG. 3*d* or 4*e;*
Figure 7B:
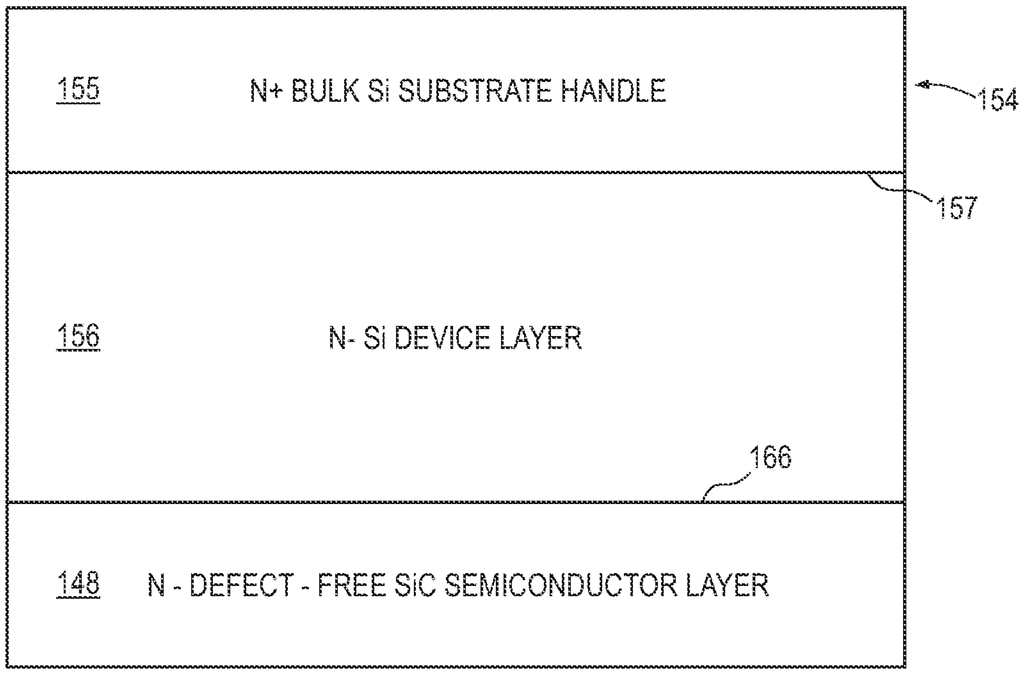

In another embodiment shown in FIGS. 7*a*-7*b*, the combination of substrate 154 and semiconductor layer 156 from FIG. 5*b* or 5*d* is joined to semiconductor layer 148 from FIG. 3*d* or semiconductor layer 152 from FIG. 4*e* using a high temperature anneal, fusion bonding, plasma activated DWB, or other DWB process. The following discussion uses semiconductor layer 148, although the same applies to semiconductor layer 152. The semiconductor layers shown in the figures are not drawn to scale.

FIG. 7*a* illustrates the combination of substrate 154 and semiconductor layer 156 from FIG. 5*b* or 5*d* disposed over surface 166 of semiconductor layer 148. Surface 166 of semiconductor layer 148 and surface 168 of semiconductor layer 156 are planarized, polished, and cleaned to be flat and smooth, prior to bonding. The lattice structures of semiconductor layer 156 and semiconductor layer 148 can be aligned to optimize adhesion. Water molecules can be applied to surfaces 166 and 168 to aid in the bonding process. Surface 168 of semiconductor layer 156 is brought into contact with surface 166 of semiconductor layer 148. DWB is accomplished with chemical bonds and intermolecular interactions at temperature, including van der Waals forces, hydrogen bonds, and covalent bonds, between surface 166 and surface 168. DWB temperatures range from ambient to 100's ° C.

FIG. 7*b* shows semiconductor layer 156 direct wafer bonded to surface 166 of semiconductor layer 148. Surface 166 of semiconductor layer 148 is substantially oxide/defect-free Si face to enable direct covalent bonding to Si face of surface 168 of semiconductor layer 156. The interface between semiconductor layer 148 and semiconductor layer 156 exhibits a strong bond with little or no defects in the crystalline structure. A similar bonding can be done with semiconductor layer 152.

Figure 8A:
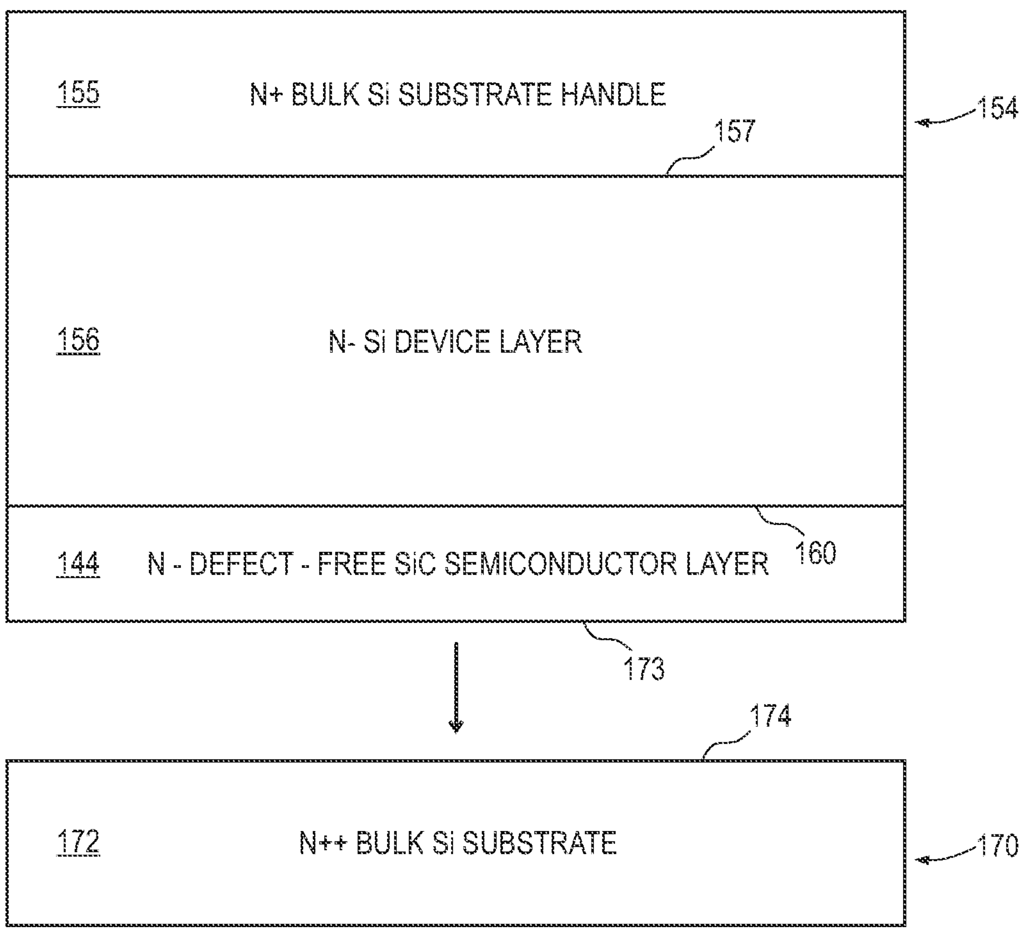
FIGS. 8*a*-8*d* illustrate a process of bonding the structure from FIG. 6*c* or 7*b* to a substrate.

The structure from FIG. 6*c* or FIG. 7*b* is joined to substrate 170 using a high temperature anneal, fusion bonding, plasma activated DWB, or other DWB process. In FIG. 8*a*, the structure from FIG. 6*c* or 7*b* is disposed over surface 174 of substrate 170. Substrate 170 contains semiconductor material 172. In one embodiment, semiconductor material 172 is N++ Si or SiC. Surface 173 of semiconductor layer 144 and surface 174 of substrate 170 are planarized, polished, and cleaned to be flat and smooth, prior to bonding. The lattice structures of semiconductor layer 144 and substrate 170 can be aligned to optimize adhesion. Water molecules can be applied to surfaces 173 and 174 to aid in the bonding process. Surface 173 of semiconductor layer 144 is brought into contact with surface 174 of substrate 170. DWB is accomplished with chemical bonds and intermolecular interactions at temperature, including van der Waals forces, hydrogen bonds, and covalent bonds, between surface 173 and surface 174. DWB temperatures range from ambient to 100's ° C.

Figure 8B:
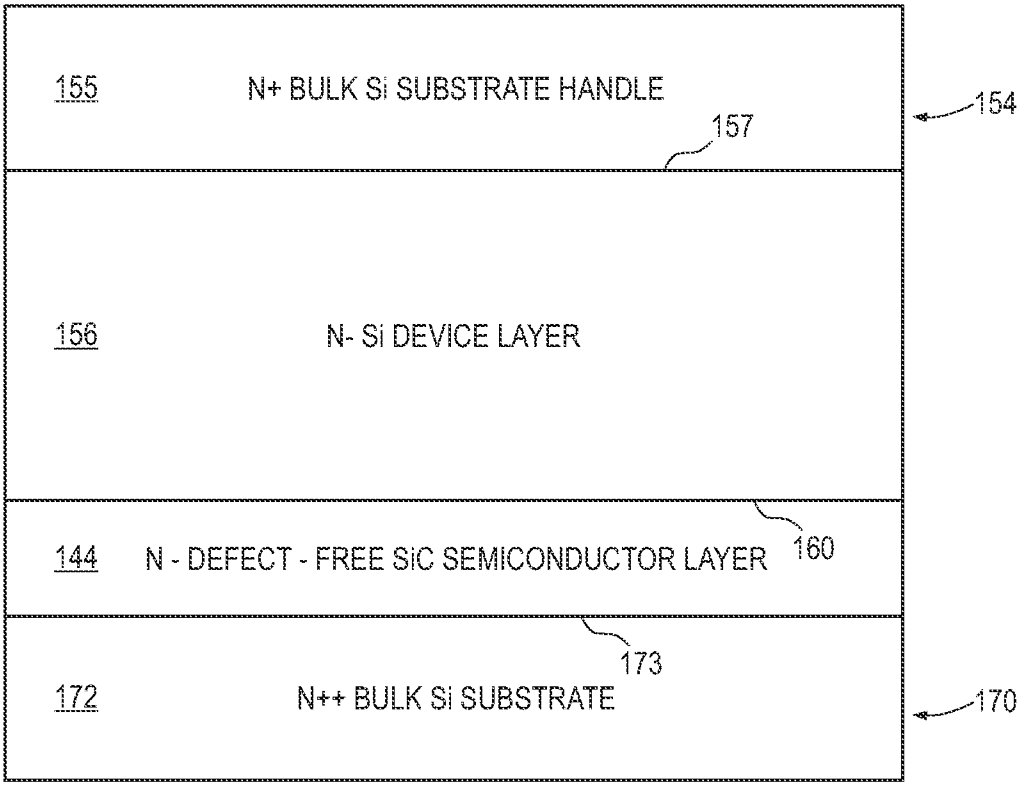

FIG. 8*b* shows semiconductor layer 144 direct wafer bonded to surface 174 of substrate 170. Substrate 170 operates as a handle or leverage point to remove substrate 154, without damage to semiconductor layer 144. Substrate 154 is removed by chemical etching, CMP, mechanical peel-off, mechanical grinding, thermal bake, UV light, or wet stripping.

Figure 8C:
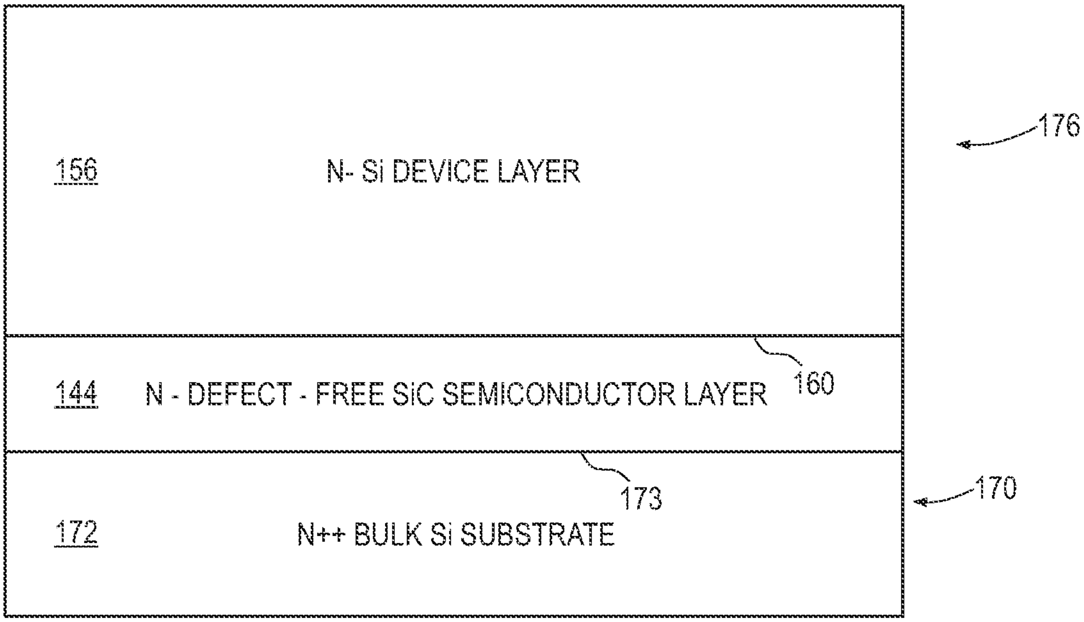

FIG. 8*c* shows SiC or 3C—SiC engineered substrate 176 containing N− Si semiconductor device layer 156, substantially defect-free N− SiC or 3C—SiC semiconductor layer 144, and N++ Si or SiC substrate 170, following removal of substrate 154. The sacrificial semiconductor layer 142 or Si substrate 120 containing substantially all the defects resulting from the heteroepitaxy interface has been removed, leaving semiconductor layer 144 near or substantially defect-free. In the prior art, work has focused on reducing defects. The present invention is not based on reducing defect generation, as discussed in the Background, but rather is about confining the defects to semiconductor layer 142 or Si substrate 120, and then removing the high defect density layer 142 or Si substrate 120. Engineered substrate 176 can be made at substantially less cost than conventional SiC substrates, while achieving near or substantially defect-free SiC base material.

Figure 8D:
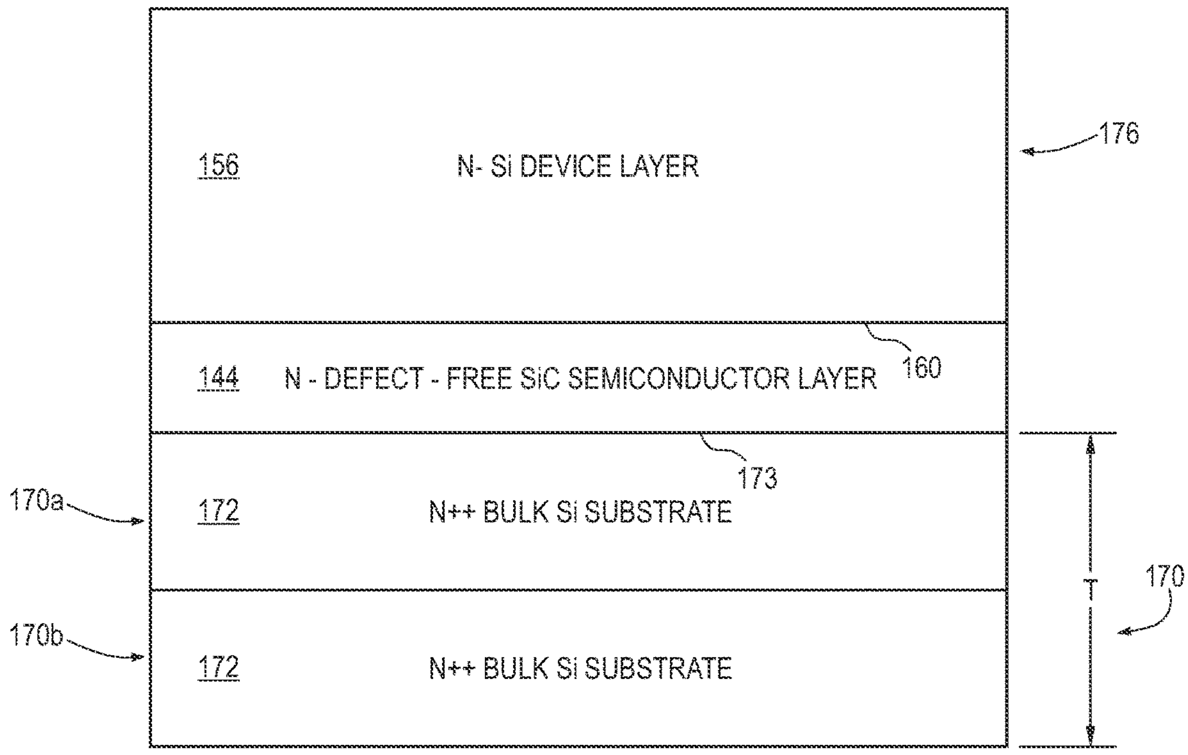

In the case of the Si epi layer grown on the SiC epi layer, as described in FIG. 8*c*, there may be, in some cases, warpage propagated through the Si epi layer due to mismatch in the coefficient of thermal expansion between the Si epi layer and SiC epi layer. In addition, there is a possible lattice mismatch and other stacking defects between the Si epi layer and SiC epi layer creating stress at the junction between the Si epi layer and SiC epi layer. To overcome these possible issues, including the potential warpage, FIG. 8*d* shows substrate 170 made with two or more heavily doped N++ Si substrates 170*a* and 170*b* bonded together using DWB, as described in FIGS. 8*a*-8*c*, with a thickness T=1000 μm. Multiple substrates can be bonded together using DWB to create a thick N++ Si substrate 170. The thick multi-layer Si substrate 170*a*-170*b* using DWB reduces or eliminates the potential warpage noted for semiconductor layer 144.

The SiC or 3C—SiC engineered substrate 176, as described in FIGS. 2-8, can be used as a foundation to form a variety of semiconductor devices. For example, engineered substrate 176 can be used as a SiC or 3C—SiC foundation to form a high voltage power MOSFET or high voltage diode.

Figure 9A:
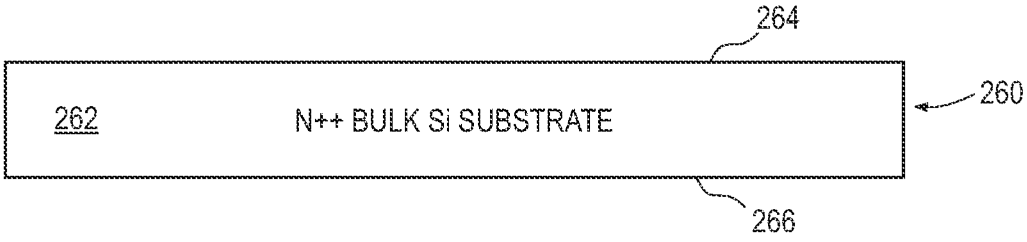
FIGS. 9*a*-9*j* illustrate a process of forming a radiation hardened substantially defect-free SiC substrate.

In another embodiment, shown in FIG. 9*a*, bulk substrate 260 contains semiconductor material 262, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, semiconductor material 262 is 4H or 6H SiC with a thickness of 450 μm. Substrate 260 includes a first surface 264 and second surface 266 opposite the first surface 264.

Figure 9B:
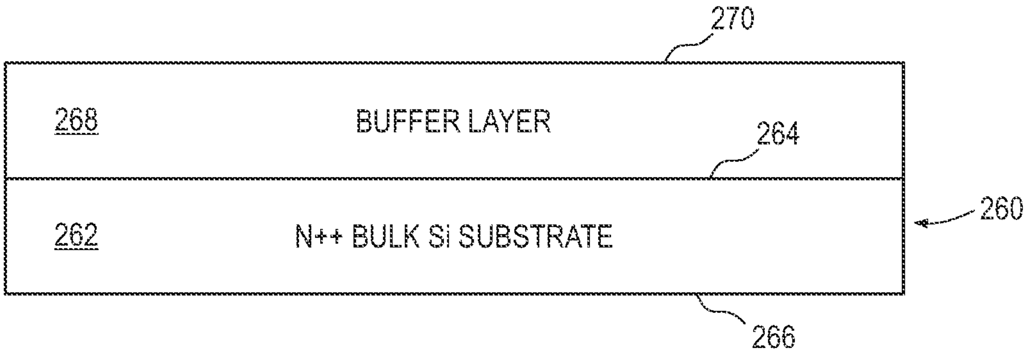

In FIG. 9*b*, semiconductor layer 268 is epitaxially grown over surface 264 of substrate 260. In one embodiment, semiconductor layer 268 is N+ SiC or 3C—SiC buffer layer with a thickness of 60 μm using a MEMS layer transfer process. The semiconductor layers shown in FIGS. 9*a*-9*j* are not drawn to scale.

Figure 9C:
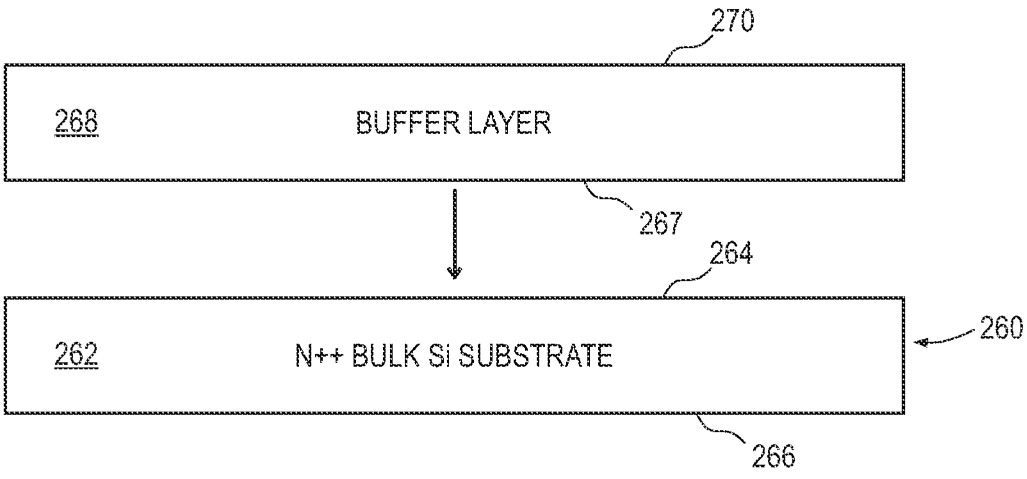
Figure 9D:
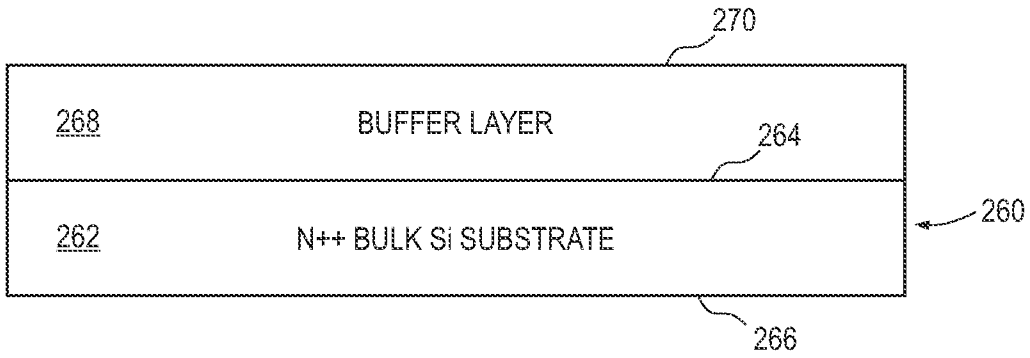

Alternatively, semiconductor layer 268 can be joined to substrate 260 using a high temperature anneal, fusion bonding, plasma activated DWB, or other DWB process. In FIG. 9*c*, semiconductor layer 268 is disposed over surface 264 of substrate 260. Surface 267 of semiconductor layer 268 and surface 264 of substrate 260 are planarized, polished, and cleaned to be flat and smooth, prior to bonding. The lattice structures of semiconductor layer 268 and substrate 260 can be aligned to optimize adhesion. Water molecules can be applied to surfaces 264 and 267 to aid in the bonding process. Surface 267 of semiconductor layer 268 is brought into contact with surface 264 of substrate 260. DWB is accomplished with chemical bonds and intermolecular interactions at temperature, including van der Waals forces, hydrogen bonds, and covalent bonds, between surface 264 and surface 267. DWB temperatures range from ambient to 100's ° C. FIG. 9*d* shows semiconductor layer 268 direct wafer bonded to surface 264 of substrate 260.

Figure 9E:
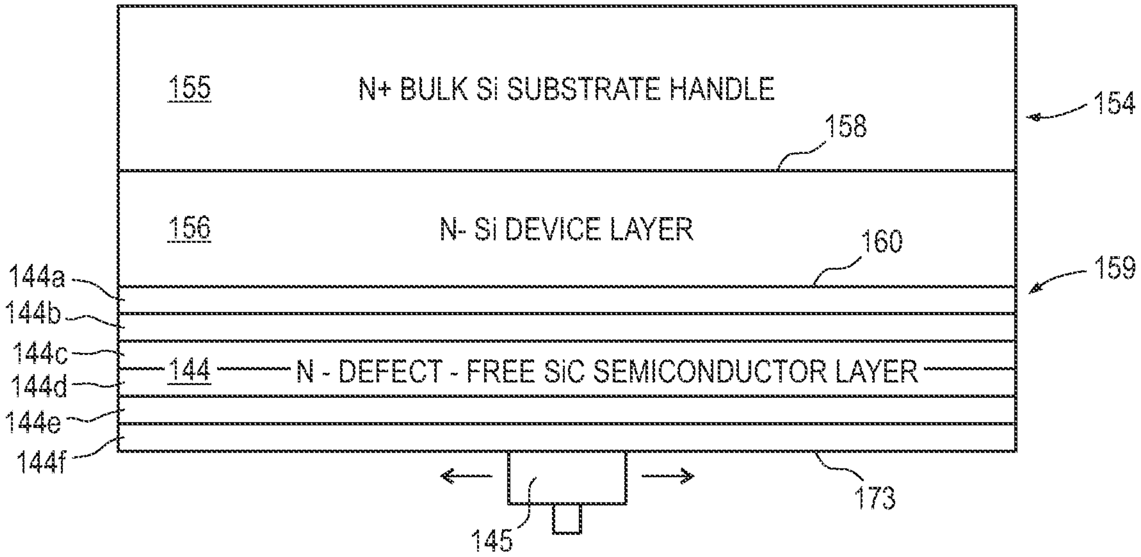

FIG. 9*e* shows engineered substrate 159 from FIG. 6*c*. The substantially defect-free SiC or 3C—SiC semiconductor layer 144 contains alternating layers or elements of the semiconductor material, e.g., Si and carbon. As an illustration, layer 144*a* is carbon, layer 144*b* is the element Si, layer 144*c* is the element carbon, layer 144*d* is Si, layer 144*e* is carbon, layer 144*f* is Si, and so on. In one embodiment, substantially defect-free SiC or 3C—SiC semiconductor layer 144, as formed, has an exposed surface 173 of layer 144*f* containing Si. Semiconductor layer 144 is typically grown on a Si wafer so layer 144*f* will be Si.

Alternatively, a portion of semiconductor layer 144 is removed by grinding with grinder 145 to expose layer 144*f* of Si. The portion of semiconductor layer 144 can be removed by etching or LDA to expose semiconductor layer 144*f* of Si. In any case, surface 173 is a Si face.

Figure 9F:
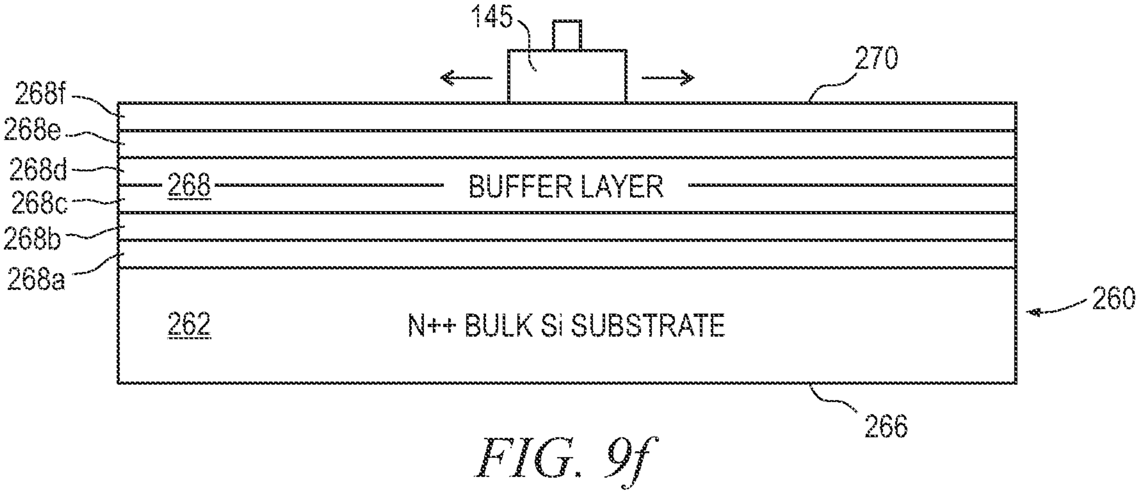

In a similar manner, SiC or 3C—SiC semiconductor layer 268 contains alternating layers or elements of the semiconductor material, e.g., Si and carbon, as shown in FIG. 9*f*. As an illustration, layer 268*a* is the element Si, layer 268*b* is the element carbon, layer 268*c* is Si, layer 268*d* is carbon, layer 268*e* is Si, layer 268*f* is carbon, and so on. In one embodiment, SiC or 3C—SiC semiconductor layer 268, as formed, has an exposed surface 270 of layer 268*f* containing carbon. Semiconductor wafer 262 is typically 4H—SiC so layer 268*f* will be carbon.

Alternatively, a portion of semiconductor layer 268 is removed by grinding with grinder 145 to expose layer 268*f* of carbon. The portion of semiconductor layer 268 can be removed by etching or LDA to expose layer 268*f* of carbon. In any case, surface 270 is a carbon face. In another embodiment, surface 173 can be the carbon face and surface 270 can be the Si face by selective formation or removal of respective material.

Figure 9G:
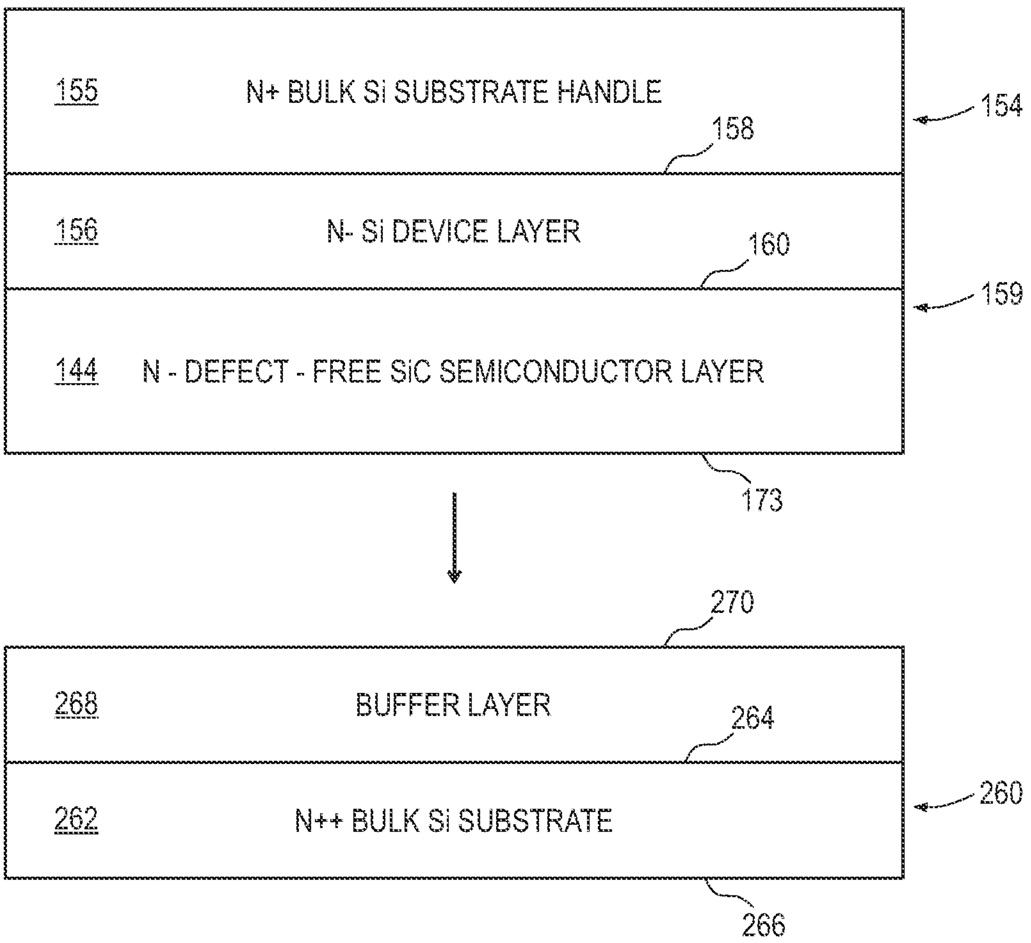

In FIG. 9*g*, semiconductor layer 144 is joined to semiconductor layer 268 using a high temperature anneal, fusion bonding, plasma activated DWB, or other DWB process. Engineered substrate 159 with an exposed Si face from semiconductor layer 144 is disposed over carbon face surface 270 of semiconductor layer 268. Surface 173 of semiconductor layer 144 and surface 270 of semiconductor layer 268 are planarized, polished, and cleaned to be flat and smooth with respective Si face and carbon face, prior to bonding. The lattice structures of semiconductor layer 144 and semiconductor layer 268 can be aligned to optimize adhesion. Water molecules can be applied to surfaces 173 and 270 to aid in the bonding process. Surface 173 of semiconductor layer 144 is brought into contact with surface 270 of semiconductor layer 268. DWB is accomplished with chemical bonds and intermolecular interactions at temperature, including van der Waals forces, hydrogen bonds, and covalent bonds, between surface 173 and surface 270. DWB temperatures range from ambient to 100's ° C.

Figure 9H:
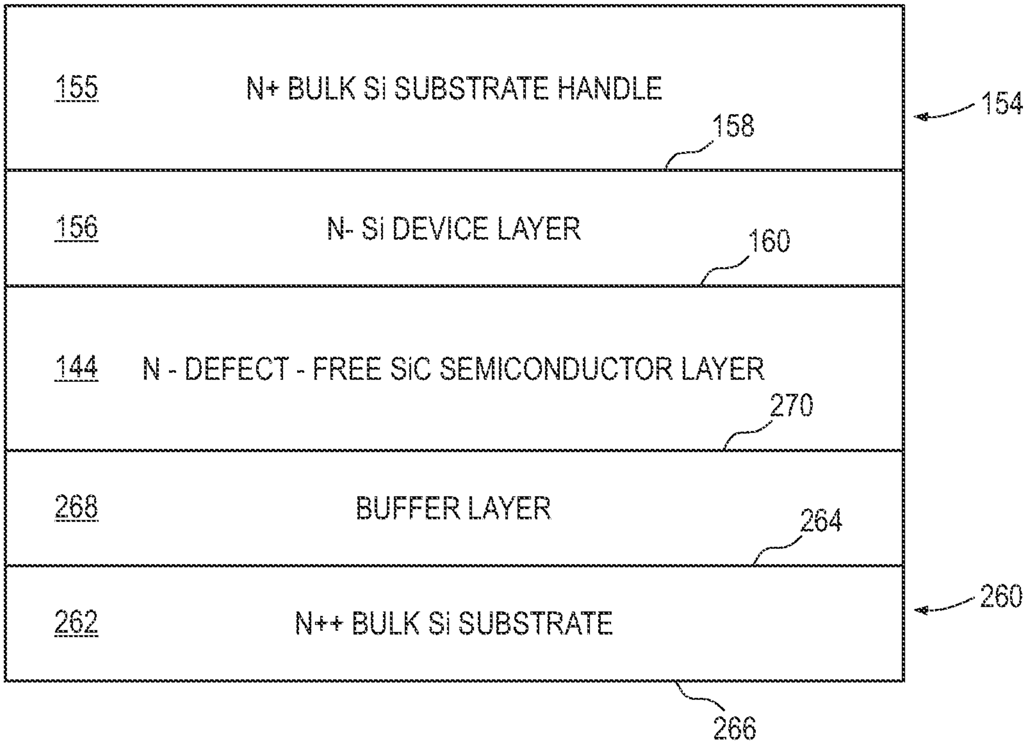

FIG. 9*h* shows engineered substrate 159 direct wafer bonded to surface 270 of semiconductor layer 268. Substrate 154 is removed by chemical etching, CMP, mechanical peel-off, mechanical grinding, thermal bake, UV light, or wet stripping.

Figure 9I:
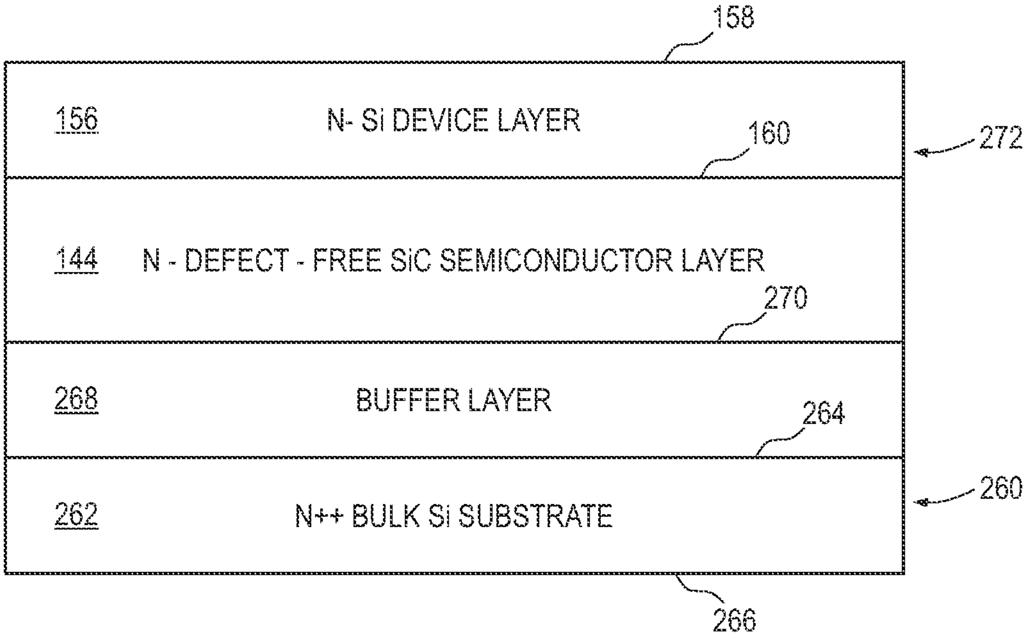
Figure 9J:
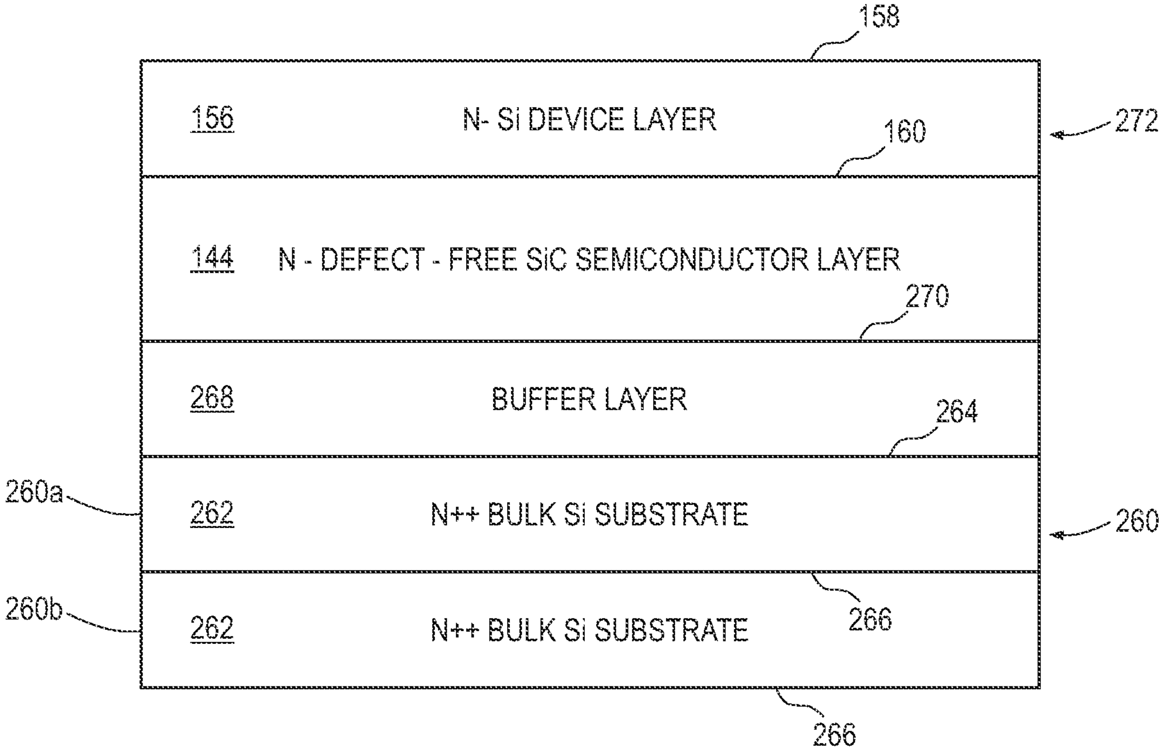

FIG. 9*i* shows SiC or 3C—SiC engineered substrate 272 containing N− Si or SiC semiconductor layer 156, substantially defect-free N− SiC or 3C—SiC semiconductor layer 144, N− SiC or 3C—SiC semiconductor layer 268, and N++ Si or SiC substrate 260, following removal of substrate 154. The Si face of surface 173 and carbon face of surface 270 provide good charge transport with robust characteristics against radiation, i.e., a radiation hardened engineered substrate. Radiation immunity can be further increased when Vanadium is doped into SiC semiconductor layer 144 to introduce deep energy level transfer into the SiC.

In the case of the Si epi layer grown on the SiC epi layer, as described in FIG. 9*i*, there may be, in some cases, warpage propagated through the Si epi layer due to mismatch in the coefficient of thermal expansion between the Si epi layer and SiC epi layer. In addition, there is a possible lattice mismatch and other stacking defects between the Si epi layer and SiC epi layer creating stress at the junction between the Si epi layer and SiC epi layer. To overcome these possible issues, including the potential warpage, FIG.

9*j* shows substrate 260 made with two or more heavily doped N++ Si substrates 260*a* and 260*b* bonded together using DWB, as described in FIGS. 9*c*-9*d*, with a thickness T=1000 μm. Multiple substrates can be bonded together using DWB to create a thick N++ Si substrate 260. The thick multi-layer Si substrate 260*a*-260*b* using DWB reduces or eliminates the potential warpage noted for semiconductor layers 144 and 268.

The SiC or 3C—SiC radiation hardened engineered substrate 272, as described in FIGS. 9*a*-9*j*, can be used as a foundation to form a variety of semiconductor devices. For example, radiation hardened engineered substrate 272 can be used as a SiC or 3C—SiC foundation to form a high voltage power MOSFET or high voltage diode.

Figure 10:
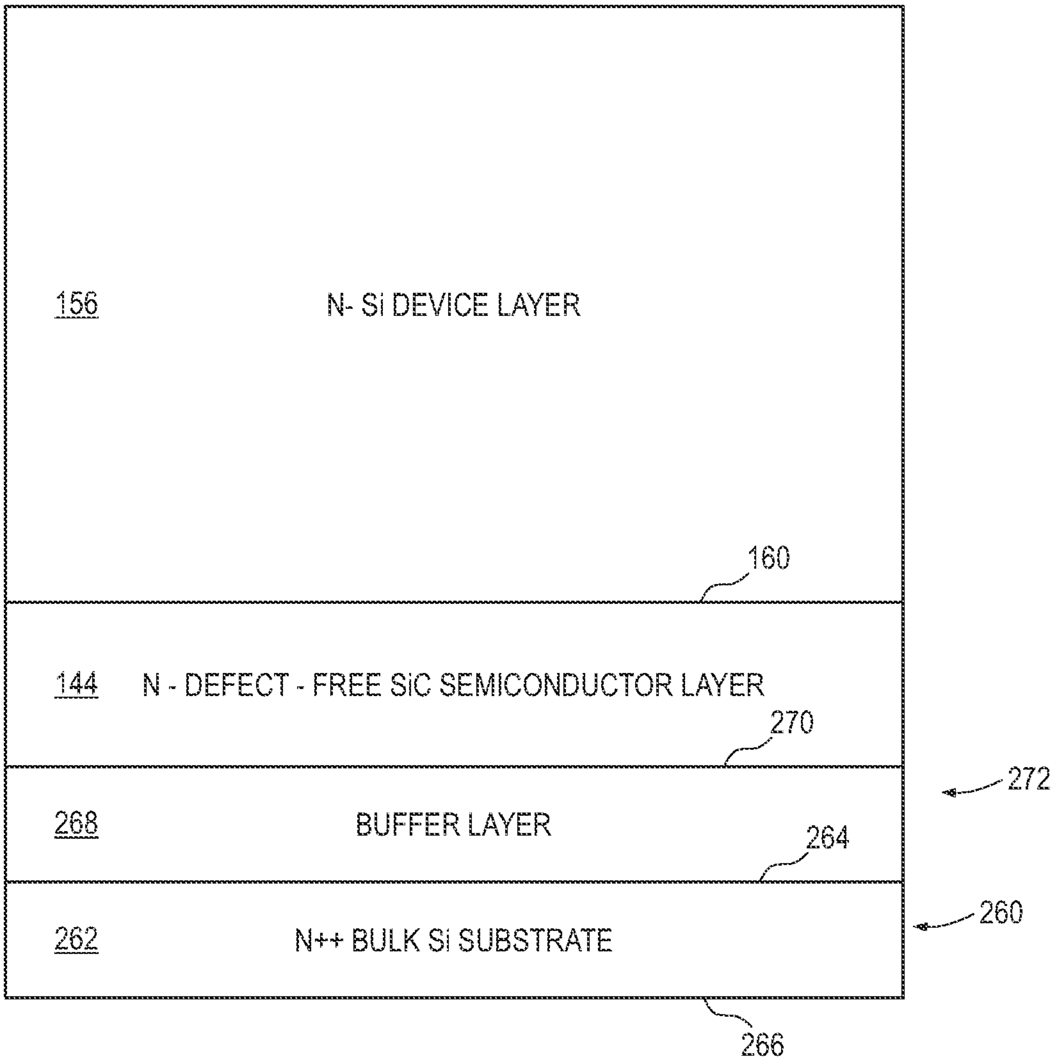
FIG. 10 illustrates the radiation hardened substantially defect-free SiC substrate.

FIG. 10 shows the SiC or 3C—SiC radiation hardened engineered substrate 272, with semiconductor device layer 156 expanded for purposes of illustration to show placement of device components.

Figure 11:
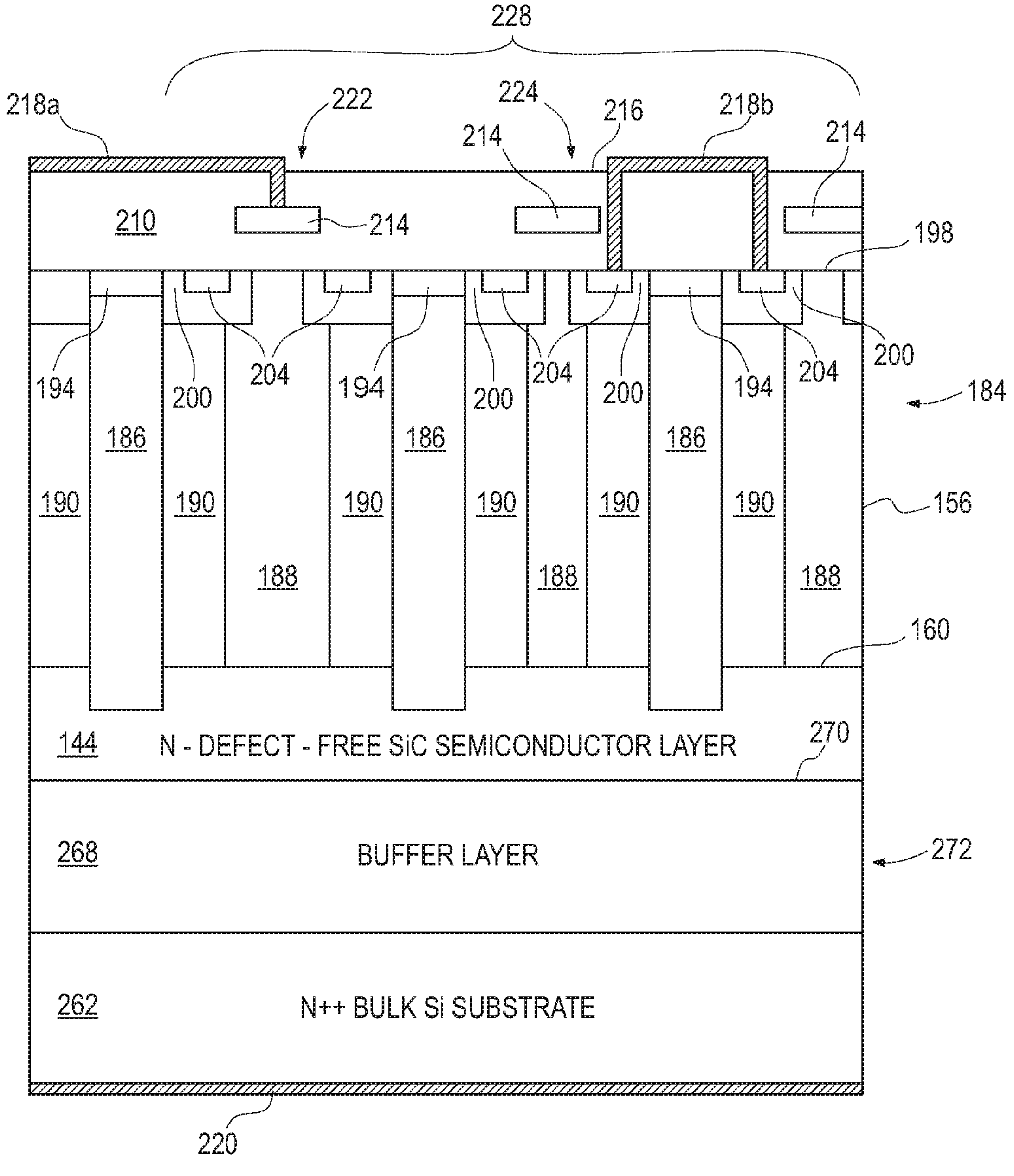
FIG. 11 illustrates a high-breakdown voltage power MOSFET cell formed on the radiation hardened substantially defect-free SiC substrate.

FIG. 11 shows high voltage power MOSFET 184 formed in semiconductor device layer 156. Trenches 186 are formed through semiconductor layer 156 and extending past surface 160 into semiconductor layer 144. Trenches 186 can be formed by deep reactive ion etching (DRIE) with a width of 3-6 μm and depth of 50-60 μm for 600 v and 100-110 μm for 1200 v. The DRIE is a highly anisotropic etch process used to create deep penetration, steep-sided holes, cavities, and trenches in wafers/substrates, typically with high aspect ratios. DRIE utilizes an ionized gas or plasma, such as sulfur hexafluoride ($SF_6$), to remove material from semiconductor layer 156. DRIE technology permits deeper trenches 186 with straighter sidewalls. To create deep anisotropic etching of silicon, the etch process switches between different plasma chemistries to provide fluorine-based etching of the silicon while protecting the sidewall of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 186. Alternatively, trenches 186 can be formed by laser direct ablation (LDA), plasma etching, reactive ion etching (RIE), sputter etching, vapor phase etching, and chemical etching. The sidewalls of each trench 186 can be smoothed using an isotropic plasma etch and may be used to remove a thin layer of silicon, e.g., 100-1000 Angstroms (A) from the trench sidewalls.

The sidewalls of trenches 186 are implanted or doped with a dopant, which may occur at predetermined angles. The dopant can be n-type material or p-type material, depending on the type of semiconductor device being made. MOSFET 184 can be an n-channel device (N-MOS) or a p-channel device (P-MOS), where “p” denotes a positive carrier type (hole) and “n” denotes a negative carrier type (electron). Although the present embodiment is described in terms of an N-MOS device, the opposite type semiconductor material can be used to form a P-MOS device.

In various implantation steps described herein, the doping is performed by ion implantation, solid diffusion, liquid diffusion, spin-on deposits, plasma doping, vapor phase doping, laser doping, or the like. Doping with boron (B), aluminum (Al), or gallium (Ga) results in a more p-type region, and doping with phosphorus (P), antimony (Sb), or arsenic (As) impurities results in n-type region 188. Other dopants may be utilized, such as bismuth (Bi) and indium (In), depending on the material of the substrate and the desired strength of the doping. In another embodiment, there is no doping performed as region 188 is not required.

The implantation angles are determined by the width of trenches 186 and the desired doping depth and is typically from about 2° to 12° from vertical. The implant is done at angles so that the bottom of each trench 186 is not implanted. The implant is performed at an energy level of about 30-200 kilo-electron-Volts (KeV) with a dose between 1e13 and 1e17 atoms/$cm^3$. Following implanting, a drive-in step at a temperature of up to 1200° C. may be performed for up to 12 hours.

The sidewalls of trenches 186 are implanted with a p-type dopant, such as boron, aluminum, or gallium impurities, with a dose of about 1e16 atoms/$cm^3$ to form p regions 190 with a width of about 1.0 μm. Alternatively, the sidewalls of trenches 186 are implanted with a p-type dopant, such as boron, aluminum, or gallium impurities, with a dose of 1e14 to 1e17 atoms/$cm^3$ to form p regions 190 with a corresponding width. The p-implant leaves columns of n region 188 and columns of p region 190. The columns of n region 188 have equal and opposite charge as the columns of p region 190. The p-implants can be performed sequentially or simultaneously. The n-type dopant and p-type dopant drive-in may occur after each implantation step, or simultaneously with the implant.

An insulating material 194 is deposited in trenches 186. In one embodiment, insulating material 194 completely fills trenches 186. Alternatively, insulating material 194 is formed over trench 186 using a MEMS layer transfer or layer bonding process to form a cap over the trench, as it is not necessary to completely fill trenches 186 with insulating material, see FIGS. 13*a*-13*d*. Using the layer transfer process to cap trench 186, there is no need to fill the trench with any material. Insulating material 194 can be polysilicon, re-crystallized polysilicon, single crystal silicon, or semi-insulating polycrystalline silicon (SIPOS). Insulating material 194 can also be silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable insulating or dielectric material. In one embodiment, insulating material 194 is SIPOS deposited into trenches 186 using a spun-on-glass (SOG) technique. The amount of oxygen content in the SIPOS is chosen to be between 2% and 80% to improve the electrical characteristics of the active region. Increasing the amount of oxygen content is desirable for electrical characteristics but varying the oxygen content also results in altered material properties. Higher oxygen content SIPOS thermally expands and contracts differently from the surrounding silicon which may lead to undesirable fracturing or cracking, especially in proximity to the interface of differing materials. Accordingly, the oxygen content of the SIPOS is optimally selected to achieve the most desirable electrical characteristics without an undesirable impact on mechanical properties.

Insulating material 194 can also be deposited in trenches 186 using other techniques, such as LPCVD, TEOS, or other suitable oxide deposition process. Insulating material 194 can be deposited in trenches 186 by a reflow process. After depositing insulating material 194, surface 198 of semiconductor layer 156 is planarized with a grinder or CMP.

A p-type dopant, such as boron, aluminum, or gallium impurities, is implanted to form p body regions 200 proximate to surface 198 of semiconductor layer 156. In the case of ion implantation of the p-type dopant into n region 188 and p regions 190, one embodiment can utilize an energy level of about 30-1000 KeV with a dose of 1e17 atoms/$cm^3$, followed by a high temperature drive-in step, e.g., a diffusion. Other implants can be deposited at appropriate dosages and energy levels. P body regions 200 can be formed at least partially by performing ion implantation of the sidewalls of trenches 186, prior to depositing insulating material 194 into the trenches. P body regions 200 operate as inversion layers to provide conduction channels through the semiconductor device.

Source regions 204 are formed within p body regions 200 proximate to surface 198. Source regions 204 are heavily doped n+ type regions, formed similar to p body regions 200. The orientation of source regions 204 with respect to p body regions 200 can be varied depending upon the configuration of MOSFET 184.

An interlayer dielectric or insulating layer 210 and gate regions 214 are formed over surface 198 of semiconductor layer 156. Gate regions 214 can be metal, doped polysilicon, amorphous silicon, or a combination thereof. In one embodiment, a first portion of insulating layer 210 is formed. Insulating layer 210 contains one or more layers of SiO2, Si3N4, SiON, Ta2O5, Al2O3, polyimide, BCB, PBO, or other suitable insulating or dielectric material. Insulating layer 210 is formed using PVD, CVD, screen printing, spin coating, spray coating, sintering, or thermal oxidation. Gate regions 214 are formed over the first portion of insulating layer 210. A second portion of interlayer dielectric or insulating layer 210 is formed over the first portion of the insulating layer and gate regions 214 to cover the gate regions. Surface 216 of insulating layer 210 can then be planarized and/or polished. In some embodiments, the first portion of insulating layer 210 can be used as a mask to form source regions 214.

A plurality of vias is formed through insulating layer 210 to source regions 204 and gate regions 214. The vias are filled with conductive material and connect to conductive layers **218*a* and 218*b*. Conductive layers 218*a* and 218*b* can be one or more layers of Al, Cu, Sn, Ni, Au, Ag, or other suitable electrically conductive material formed using patterning with PVD, CVD, sputtering, electrolytic plating, electroless plating process, or other suitable metal deposition process. Conductive layer 218*a* makes electrical contact to gate region 214, and conductive layer 218*b* makes electrical contact to source regions 204. Conductive layers 218*a* and 218*b* can be electrically isolated or electrically common depending on the configuration and operation of MOSFET 184. As a vertical device, the drain of MOSFET 184 is provided by n region 156 (n drift region) and n-type engineered substrate 272. Current flow path includes conductive layer 218*b*, source regions 120, the channel below gate region 214, and the n-type layers of engineered substrate 272 to the backside drain contact 220**.

MOSFET 184 is a multi-cell vertical power MOSFET having applications in AC-DC and DC-DC power converters, aerospace, and general purpose portable electrical devices. MOSFET 184 is designed for high-breakdown voltage, radiation hardened, high reliability, lightweight, low voltage, and low on resistance applications, such as DC to DC converters, aerospace, and high-performance computing. In particular, MOSFET 184 merges MEMS, super-junction, and WBG engineered cathode to achieve the high breakdown voltage, performance, manufacturability, low cost, lightweight, and low on resistance. FIG. 11 illustrates two cells 222 and 224 in active region 228. The MOSFET cells are electrically connected in parallel to form a power MOSFET for high current carrying capacity. Engineered substrate 272 represents a WBG engineered drain that enhances the device breakdown voltage to 1200V and reduces $R_{DSON}$, while providing radiation hardening protection, manufacturability, low cost, and lightweight. Radiation immunity can be further increased when vanadium is doped into SiC semiconductor layer 144 to introduce deep energy level transfer into the SiC.

The semiconductor structure between surface 160 and surface 198 substantially represents a super-junction semiconductor device. The super-junction cells 222, 224 account for the total breakdown voltage capability. The role of buffer layer 268 is to increase radiation immunity. Adding SiC buffer layer 268 to the same 1200V Si MOSFET enhances radiation immunity. The 1200 v breakdown capacity is useful of efficient power distribution systems in aerospace applications, where the above advantages are particularly important. MOSFET 184 can sustain 1200 v blocking with no heavy ion-induced permanent destructive effects upon exposure to high energy radiation of 87 Mev $cm^2$/mg. Near defect-free SiC semiconductor layer 144 together with Si device layer 156 provides the desired 1200 v.

The structure of MOSFET 184 has a feature size that is scalable to reduce cell size and provide a higher cell density, which increases the number of cells in the MOSFET and reduces $RDS_{ON}$ to about 90 milliohms at maximum drain current ID of 40 amperes. The semiconductor structure between surface 160 and surface 198 substantially represents a super-junction semiconductor device. Power MOSFET 184 can sustain 1200 v blocking, while delivering low Rdson of 90 milliohms at ID max=40A. The high-breakdown voltage characteristics of FIG. 11 can be applied to an IGBT, CTIGBT, thyristor, diode, and other MOS gated devices. For example, power MOSFET 184 from FIG. 11 can be formed on engineered substrate 176.

By leveraging the inherent benefits of MEMS manufacturing techniques and embedding SiC into the drain of the SJMOS structure, a new approach to the design and manufacture of robust radiation hardening processes provides suitable for the deep space environment. The early super-junction products demonstrated a substantial competitive advantage with respect to Rdson*area product that allows for a 5× improvement over standard planar MOSFETs. Embedding SiC into the drain has the potential to improve device parametric performance by another 5× plus enhances radiation hardness to meet SEGR performance for 1200V devices. The merger of SJMOS structures-MEMS manufacturing techniques-WBG material creates a new class of merged power semiconductor devices that in this case has the potential to sustain 1200V blocking with no heavy-ion-induced permanent destructive effects upon exposure to high energy radiation of 87 Mev-$cm^2$/mg while delivering Rdson of 90 milliohms at ID max=40A.

Figure 12:
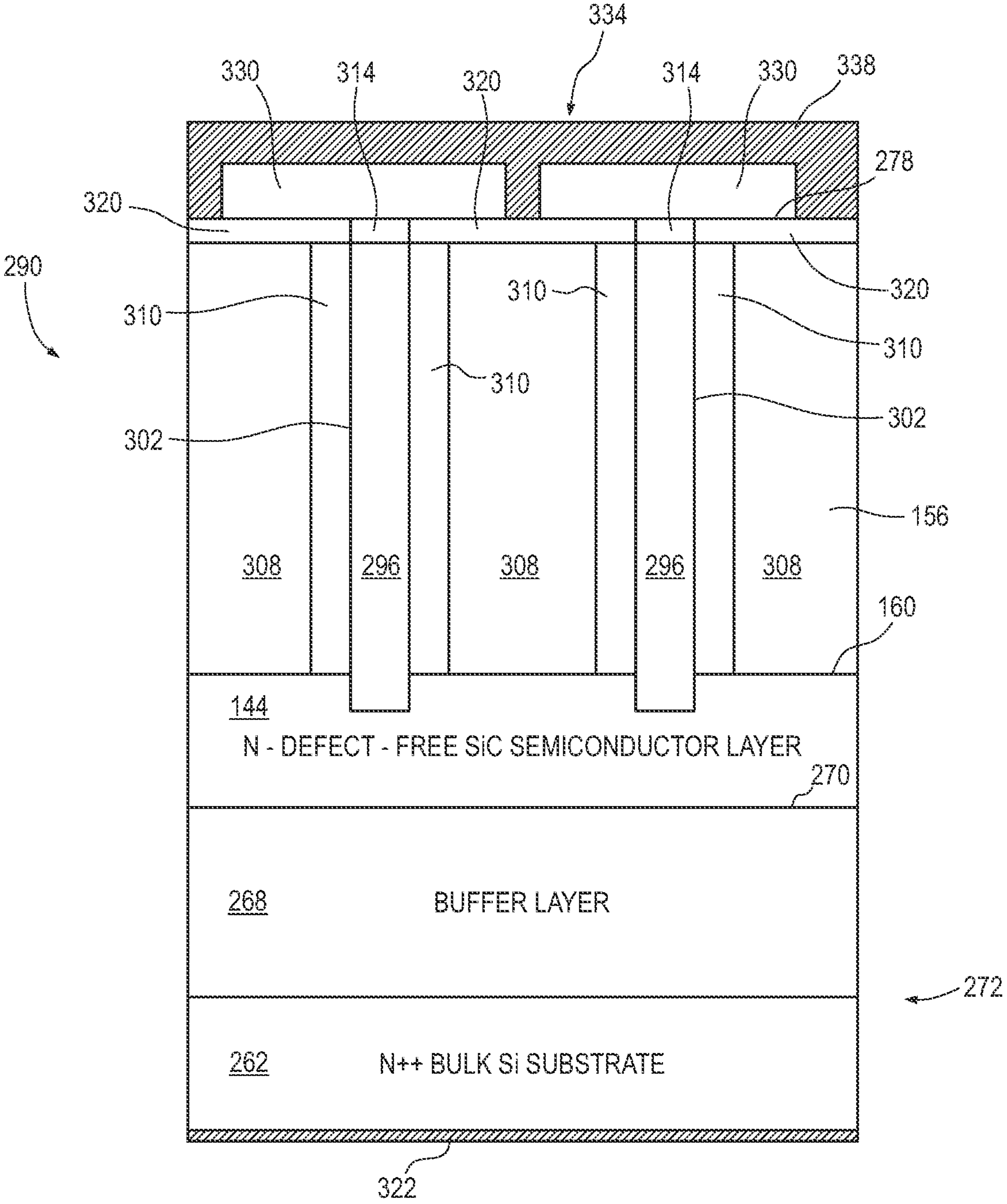
FIG. 12 illustrates a high-breakdown voltage diode formed on the radiation hardened substantially defect-free SiC substrate.

In another embodiment, continuing from FIG. 10, high voltage power diode 290 is formed in semiconductor device layer 156, as shown in FIG. 12. Trenches 296 are formed through semiconductor layer 274 and extending past surface 160 into semiconductor layer 156. Trenches 296 can be formed by deep reactive ion etching (DRIE) with a width of 3-6 μm and depth of 50-60 μm for 600 v and 100-110 μm for 1200 v. Alternatively, trenches 296 can be formed by LDA, plasma etching, RIE, sputter etching, vapor phase etching, and chemical etching. Sidewalls 302 of trenches 296 are implanted or doped with a dopant, which may occur at predetermined angles. The dopant can be n-type material to form n region 308. The implant is performed at an energy level of about 30-200 KeV with a dose ranging from about 1e13 to 1e17 atoms/$cm^3$. Sidewalls 302 of trenches 296 are implanted with a p-type dopant, such as boron, aluminum, or gallium impurities, to form p regions 310 with a width of about 1 μm. The p-implant leaves columns of n region 308 and columns of p region 310. The columns of n region 308 have equal and opposite charge as the columns of p region 310.

An insulating material 314 is deposited in trenches 296. In one embodiment, insulating material 314 completely fills trenches 296. Alternatively, insulating material 314 forms a cap over trenches 296, as it is not necessary to completely fill trenches 296 with insulating material. After depositing insulating material 314, surface 278 is planarized by CMP. A p-type dopant, such as boron, aluminum, or gallium impurities, is implanted to form p body regions 320 proximate to surface 278 of semiconductor layer 156. As a vertical device, the anode of diode 290 is provided by p region 320, and the anode is provided by n region 308, SiC or 3C—SiC radiation hardened engineered substrate 272 to the backside contact 322. An interlayer dielectric or insulating layer 330 is formed over surface 278 of semiconductor layer 156. A plurality of vias is formed through insulating layer 330 and extending to p regions 320. The vias are filled with conductive material and connect to conductive layer 338. Diode 290 contains an array of cells such as cell 334 to achieve the high-breakdown voltage, high reliability, lightweight, low voltage, and low on resistance.

Diode 290 is designed for high-breakdown voltage, radiation hardened, high reliability, lightweight, low voltage, and low on resistance applications, such as DC to DC converters, aerospace, and high-performance computing. In particular, diode 290 merges MEMS, super-junction, and WBG engineered cathode to achieve the high breakdown voltage, performance, manufacturability, low cost, lightweight, and low on resistance. The semiconductor structure between surface 160 and surface 278 substantially represents a super-junction semiconductor device. The 1200 v breakdown capacity is useful of efficient power distribution systems in aerospace applications, where the above advantages are particularly important. Diode 290 can sustain 1200 v blocking with no heavy ion-induced permanent destructive effects upon exposure to high energy radiation of 87 Mev $cm^2$/mg. The high-breakdown voltage characteristics can be applied to an IGBT, CTIGBT, thyristor, power MOSFET, and other MOS gated devices.

Power MOSFET 184 and diode 290 are applicable to electrical equipment in aerospace, personal computers, energy systems, telecommunication systems, audio-video equipment, consumer electrical products, automotive components, portable electrical devices, data processing centers, LED lighting, electric vehicles, and other applications which utilize integrated circuits or semiconductor chips.

Figure 13A:
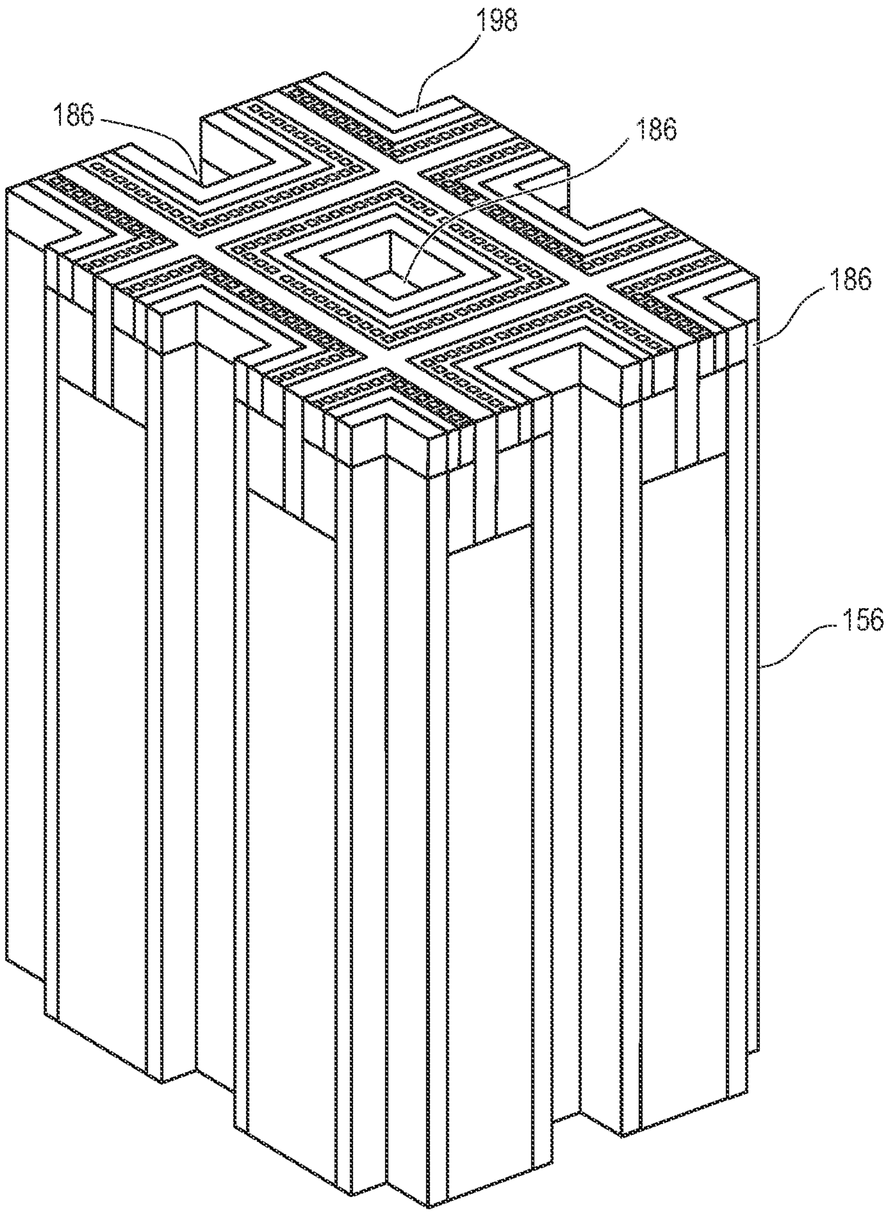
FIGS. 13*a*-13*d* illustrate further detail of the MEMS layer transfer or layer bonding process.
Figure 13B:
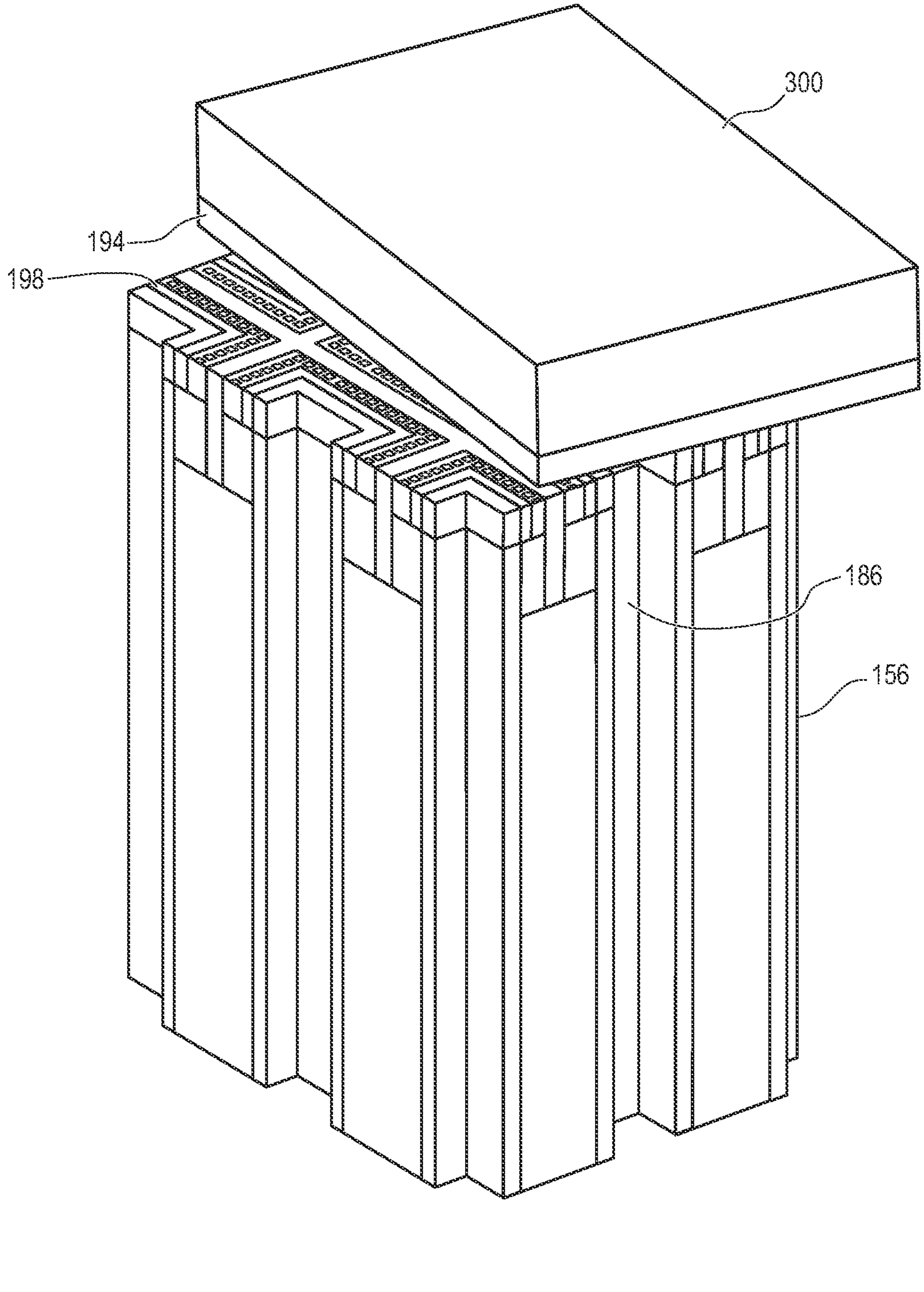
Figure 13C:
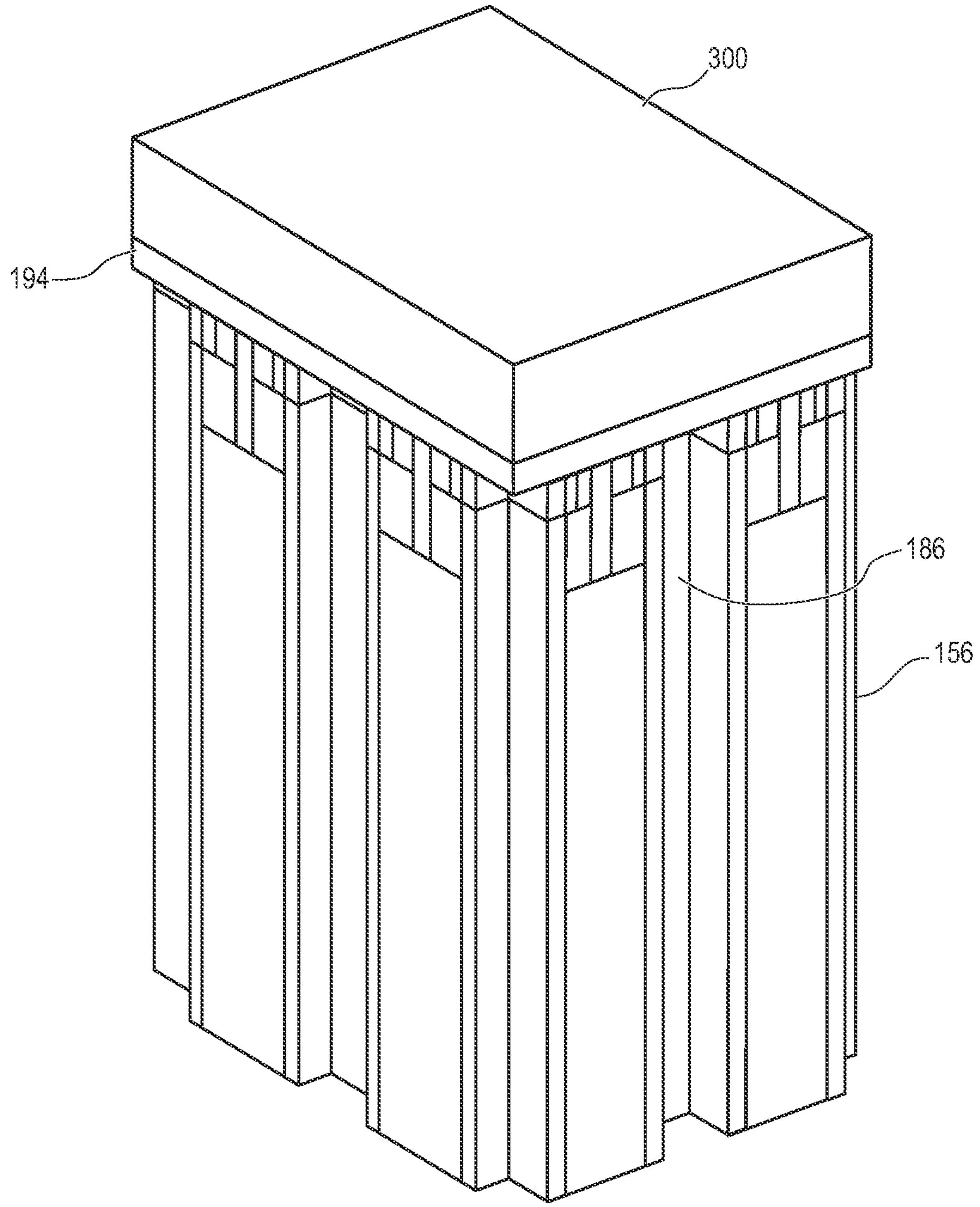
Figure 13D:
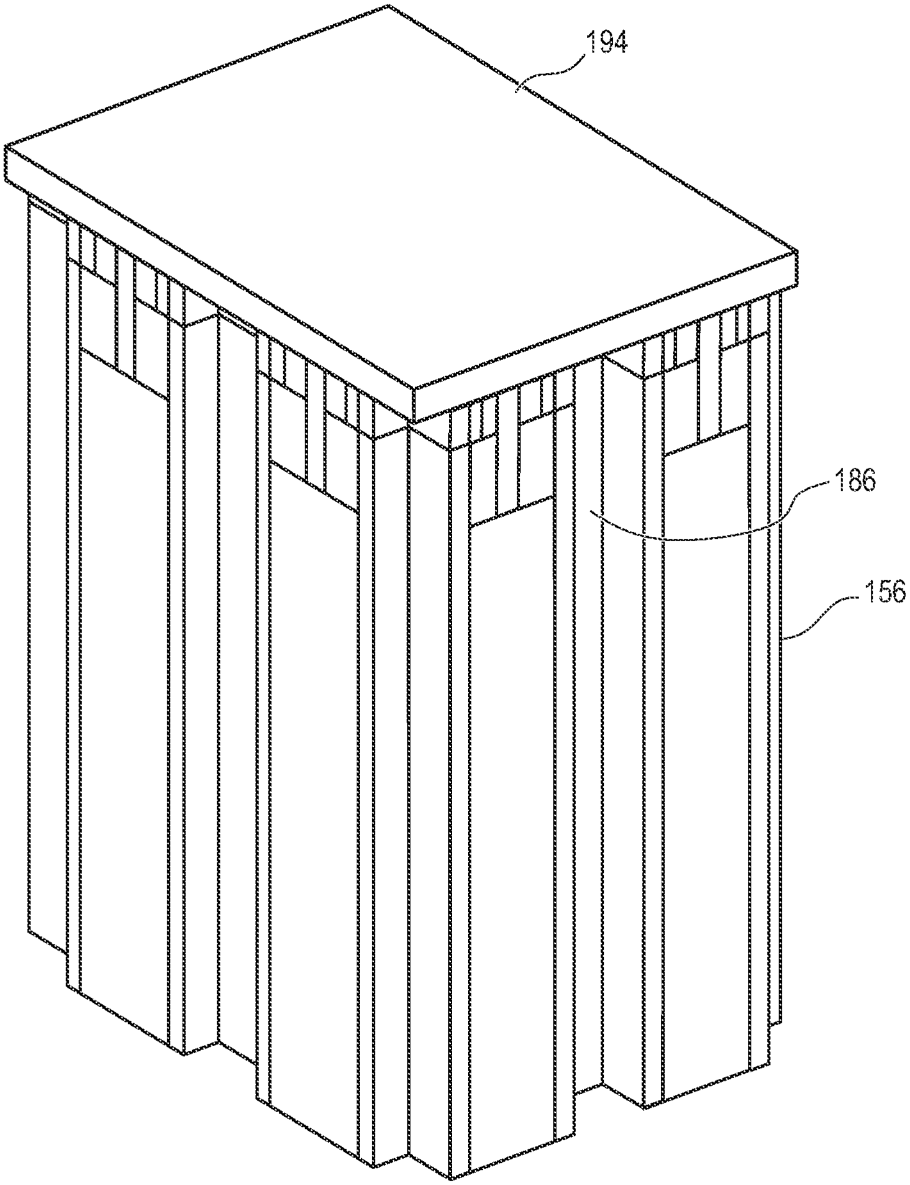

FIGS. 13*a*-13*d* show further detail of the MEMS layer transfer or layer bonding process. FIG. 13*a* shows semiconductor layer 156 with surface 198 and a plurality of trenches 186. FIG. 13*b* shows silicon substrate 300 with insulating layer 194 disposed over the substrate. In one embodiment, insulating layer 194 is SiO2 grown on silicon substrate 300. Silicon substrate 300 is disposed over surface 198 with insulating layer 194 oriented toward the surface of semiconductor layer 156. In FIG. 13*c*, silicon substrate 300 is DWB to semiconductor layer 156 with insulating layer 194 contacting surface 198. Insulating layer 194 covers and seals trenches 186. In FIG. 13*d*, silicon substrate 300 is removed leaving insulating layer 194 disposed over surface 198, and partially into trench 186, to cap each trench, as in FIG. 11. The MEMS layer transfer or layer bonding process uses a thin SiO2 layer to cap an open deep trench structure forming a hermetically sealed cavity in the trench. Silicon substrate 300 provides structural support for insulating layer 194 during the bonding process.

The transferred $SiO_2$ layer 194 then forms part of ILD 210 for contact/metal. ILD 210 has a low dielectric constant k, mechanical stability, and thermal conductivity. The transferred $SiO_2$ layer 194 integrates with ILD 210 for the MOSFET portion of the device. MEMS manufacturing methods applied to super-junction devices involves the adoption of deep reaction ion trench etching, side wall doping, and layer transfer techniques to eliminate trench refill as its basic fabrication process. The MEMS technique replaces trench refill process by using DWB a mems cap over the trench and seal the vacuum trench. The MEMS layer transfer or layer bonding process has advantages of lower cost for shorter processes, reduction of thermal stress for less thermal process steps, and reduction of mechanical stress by eliminating refill material. The merger of deep reactive ion etch MEMS fabrication process into the mSJ-MOS design is a key step for the high aspect ratio trench to enable charge balance through trench sidewall implantation.

In summary, engineered substrates 176 and 272 use hot wall CVD reactor growth of a heteroepitaxial layer of N− 3C—SiC on a host sacrificial silicon compliant substrate (first wafer) that is then direct wafer bonded to a N− Si/N++ Si second wafer. The MEMS direct wafer bonding processes include plasma activated DWB of a substantially defect-free N− 3C—SiC/N− Si heteroepitaxy film 30 mm thick to a silicon substrate to create an advanced engineered substrate that becomes the starting material for CMOS processing of a 1200V SJMOS embedded drain SiC high voltage power MOSFET.

The combination of defect reduction techniques and DWB in MEMS substrates has produced engineered substrates 176 and 272, where the thin high density defect region always found at the 3C—SiC/Si heterointerface becomes a sacrificial layer and is removed along with the sacrificial compliant substrate from the remaining substantially defect-free thick SiC or 3C—SiC film and leaving only the high voltage sustaining nearly defect-free N− SiC or 3C—SiC layer bonded to a N− Si/n++ Si second wafer. Electrons flow to the SiC or 3C—SiC layer in the drain but holes flow only in the silicon. From this standpoint, it is reasonable to form a drift region by silicon where impact ionization and recombination occur to prevent the opportunity to expand stacking faults in the SiC or 3C—SiC layer. The engineered substrate 272 can pass high energy radiation with no heavy ion-induced permanent destructive effects upon exposure to high energy radiation of 87 Mev $cm^2$/mg, while delivering low Rdson of 90 milliohms at ID max=40A.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a first substrate comprising silicon and including a patterned surface;

forming a first semiconductor layer comprising silicon carbide over the patterned surface of the first substrate by, (a) forming a sacrificial layer comprising silicon carbide in contact with the patterned surface of the first substrate, and (b) forming the first semiconductor layer in contact with the sacrificial layer with defects being formed in the patterned surface of the first substrate and the sacrificial layer leaving the first semiconductor layer as substantially defect free;

removing the sacrificial layer and first substrate leaving the first semiconductor layer as substantially defect free;

disposing a first surface of a second semiconductor layer comprising silicon in contact with a first surface of the first semiconductor layer being substantially defect free;

providing a second substrate with a buffer layer in contact with a first surface of the second substrate;

disposing the first semiconductor layer and second semiconductor layer over the buffer layer; and forming an electrical component at least partially within the second semiconductor layer, wherein forming the electrical component includes, (c) forming a trench through the second semiconductor layer and extending into the first semiconductor layer, (d) forming a first column of semiconductor material having a first conductivity type and extending through the second semiconductor layer, (e) forming a second column of semiconductor material having a second conductivity type opposite the first conductivity type and in contact with a side surface of the first column of semiconductor material within the second semiconductor layer opposite the trench, and (f) forming a source region over the first column of semiconductor material.

2. The method of claim 1, wherein the buffer layer provides characteristics of radiation hardening.

3. The method of claim 2, wherein the buffer layer provides at least a portion of radiation hardening of at least 87 MeV $cm^2$/mg.

4. The method of claim 1, further including forming a compliant layer over a second surface of the first substrate opposite the patterned surface of the first substrate.

5. The method of claim 1, wherein forming the buffer layer includes forming alternating layers of silicon and carbon.

6. A method of making a semiconductor device, comprising:

providing a first substrate comprising silicon and including a patterned surface;

forming a first semiconductor layer comprising silicon carbide over the patterned surface of the first substrate by, (a) forming a sacrificial layer comprising silicon carbide in contact with the patterned surface of the first substrate, and (b) forming the first semiconductor layer in contact with the sacrificial layer with defects being formed in the patterned surface of the first substrate and the sacrificial layer leaving the first semiconductor layer as substantially defect free;

removing the sacrificial layer and first substrate leaving the first semiconductor layer as substantially defect free;

disposing a first surface of a second semiconductor layer comprising silicon over a first surface of the first semiconductor layer being substantially defect free;

providing a second substrate;

disposing the first semiconductor layer and second semiconductor layer over the second substrate with a second surface of the first semiconductor layer in contact with a surface of the second substrate; and forming an electrical component at least partially within the second semiconductor layer, wherein forming the electrical component includes, (c) forming a trench through the second semiconductor layer and extending into the first semiconductor layer, (d) forming a first column of semiconductor material having a first conductivity type and extending through the second semiconductor layer, (e) forming a second column of semiconductor material having a second conductivity type opposite the first conductivity type and in contact with a side surface of the first column of semiconductor material within the second semiconductor layer opposite the trench, and (f) forming a source region over the first column of semiconductor material.

7. The method of claim 6, wherein the second substrate includes a buffer layer in contact with the second surface of the first semiconductor layer.

8. The method of claim 7, wherein the buffer layer provides at least a portion of radiation hardening of at least 87 MeV $cm^2$/mg.

9. The method of claim 6, further including forming a compliant layer over a second surface of the first substrate opposite the patterned surface of the first substrate.

10. The method of claim 7, wherein forming the buffer layer includes forming alternating layers of silicon and carbon.

11. A method of making a semiconductor device, comprising:

providing a first substrate comprising silicon;

forming a first semiconductor layer comprising silicon carbide over a first surface of the first substrate by, (a) forming a sacrificial layer comprising silicon carbide in contact with the first surface of the first substrate, and (b) forming the first semiconductor layer in contact with the sacrificial layer with defects being formed in the sacrificial layer leaving the first semiconductor layer as substantially defect free;

removing the sacrificial layer and first substrate leaving the first semiconductor layer as substantially defect free;

disposing a first surface of a second semiconductor layer over a first surface of the first semiconductor layer being substantially defect free;

providing a second substrate;

disposing the first semiconductor layer and second semiconductor layer over the second substrate with a second surface of the first semiconductor layer in contact with a surface of the second substrate; and forming an electrical component at least partially within the second semiconductor layer, wherein forming the electrical component includes, (c) forming a trench through the second semiconductor layer and extending into the first semiconductor layer, (d) forming a first column of semiconductor material having a first conductivity type and extending through the second semiconductor layer, (e) forming a second column of semiconductor material having a second conductivity type opposite the first conductivity type and in contact with a side surface of the first column of semiconductor material within the second semiconductor layer opposite the trench, and (f) forming a source region over the first column of semiconductor material.

12. The method of claim 11, wherein forming the electrical component includes forming a MOSFET device.

13. The method of claim 11, wherein the second substrate includes a buffer layer in contact with the second surface of the first semiconductor layer.

14. The method of claim 11, wherein the second semiconductor layer includes silicon.

15. The method of claim 13, wherein the buffer layer contributes to radiation hardening of at least 87 MeV $cm^2/mg$.

16. The method of claim 11, further including forming a compliant layer over a second surface of the first substrate opposite the first surface of the first substrate.

17. The method of claim 13, wherein forming the buffer layer includes forming alternating layers of silicon and carbon.

* * * * *